(12) United States Patent
Moriwaki

(10) Patent No.: US 10,115,642 B2
(45) Date of Patent: Oct. 30, 2018

(54) SEMICONDUCTOR DEVICES COMPRISING NITROGEN-DOPED GATE DIELECTRIC, AND METHODS OF FORMING SEMICONDUCTOR DEVICES

(71) Applicant: Micron Technology, Inc., Boise, ID (US)

(72) Inventor: Yoshikazu Moriwaki, Higashihiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/893,414

(22) Filed: Feb. 9, 2018

(65) Prior Publication Data
US 2018/0174926 A1 Jun. 21, 2018

Related U.S. Application Data

(62) Division of application No. 15/365,126, filed on Nov. 30, 2016, now Pat. No. 9,922,885.

(51) Int. Cl.
| | |
|---|---|
| *H01L 27/092* | (2006.01) |
| *H01L 21/8238* | (2006.01) |
| *H01L 21/3115* | (2006.01) |
| *H01L 29/51* | (2006.01) |
| *H01L 21/28* | (2006.01) |
| *H01L 29/49* | (2006.01) |

(52) U.S. Cl.
CPC ......... *H01L 21/823857* (2013.01); *H01L 21/823842* (2013.01); *H01L 27/092* (2013.01); *H01L 21/28158* (2013.01); *H01L 21/31155* (2013.01); *H01L 29/49* (2013.01); *H01L 29/513* (2013.01); *H01L 29/517* (2013.01); *H01L 29/518* (2013.01)

(58) Field of Classification Search
CPC ..... H01L 21/823857; H01L 21/823842; H01L 27/092
See application file for complete search history.

(56) References Cited

U.S. PATENT DOCUMENTS

| | | | |
|---|---|---|---|
| 2006/0102968 A1* | 5/2006 | Bojarczuk, Jr. ... | H01L 21/28194 257/392 |
| 2006/0131672 A1* | 6/2006 | Wang ..................... | H01L 29/94 257/410 |
| 2010/0197128 A1* | 8/2010 | Schaeffer ........ | H01L 21/823807 438/591 |
| 2014/0035058 A1* | 2/2014 | Min ..................... | H01L 27/092 257/369 |

* cited by examiner

*Primary Examiner* — Moazzam Hossain
*Assistant Examiner* — Warren H Kilpatrick
(74) *Attorney, Agent, or Firm* — Wells St. John P.S.

(57) ABSTRACT

Some embodiments include semiconductor devices having first transistors of a first channel type and having second transistors of a second channel type. The first transistors include a first gate electrode, a first nitrogen-doped gate dielectric layer and a first high-k material. The second transistors include a second gate electrode, a second nitrogen-doped gate dielectric layer and a second high-k material. The second nitrogen-doped gate dielectric layer is doped with nitrogen to a different peak concentration than the first nitrogen-doped gate dielectric layer. Some embodiments include methods of forming PMOS and NMOS transistors having nitrogen-doped gate dielectric material.

20 Claims, 13 Drawing Sheets

SEMICONDUCTOR DEVICES COMPRISING NITROGEN-DOPED GATE DIELECTRIC, AND METHODS OF FORMING SEMICONDUCTOR DEVICES

RELATED PATENT DATA

This patent resulted from a divisional of U.S. patent application Ser. No. 15/365,126, which was filed Nov. 30, 2016 and which is hereby incorporated by reference herein.

TECHNICAL FIELD

Semiconductor devices comprising nitrogen-doped gate dielectric, and methods of forming semiconductor devices.

BACKGROUND

Integrated circuitry may include CMOS (complementary metal oxide semiconductor); with a CMOS structure comprising a PMOS (p-type metal oxide semiconductor; i.e., positive channel metal oxide semiconductor) transistor and an NMOS (n-type metal oxide semiconductor; i.e., negative channel metal oxide semiconductor) transistor. It is desired to develop improved CMOS architectures having PMOS and NMOS transistors tailored to achieve desired operational parameters, and to develop methods for fabricating such CMOS architectures.

DETAILED DESCRIPTION OF THE ILLUSTRATED EMBODIMENTS

Some embodiments include recognition that CMOS performance may be improved by providing nitrogen dopant into gate dielectric layers associated with PMOS and NMOS transistors, and further recognition that it may be advantageous to have a lower concentration of nitrogen dopant in gate dielectric layers associated with PMOS transistors than in gate dielectric layers associated with NMOS transistors. Some embodiments include methods which may be used to fabricate CMOS having nitrogen dopant in dielectric layers of both NMOS transistors and PMOS transistors, with the nitrogen dopant concentration in the dielectric layers of the PMOS transistors being less than the nitrogen dopant concentration in the dielectric layers of the NMOS transistors. Example embodiments are described with reference to FIGS. 1-31.

Figure 1:
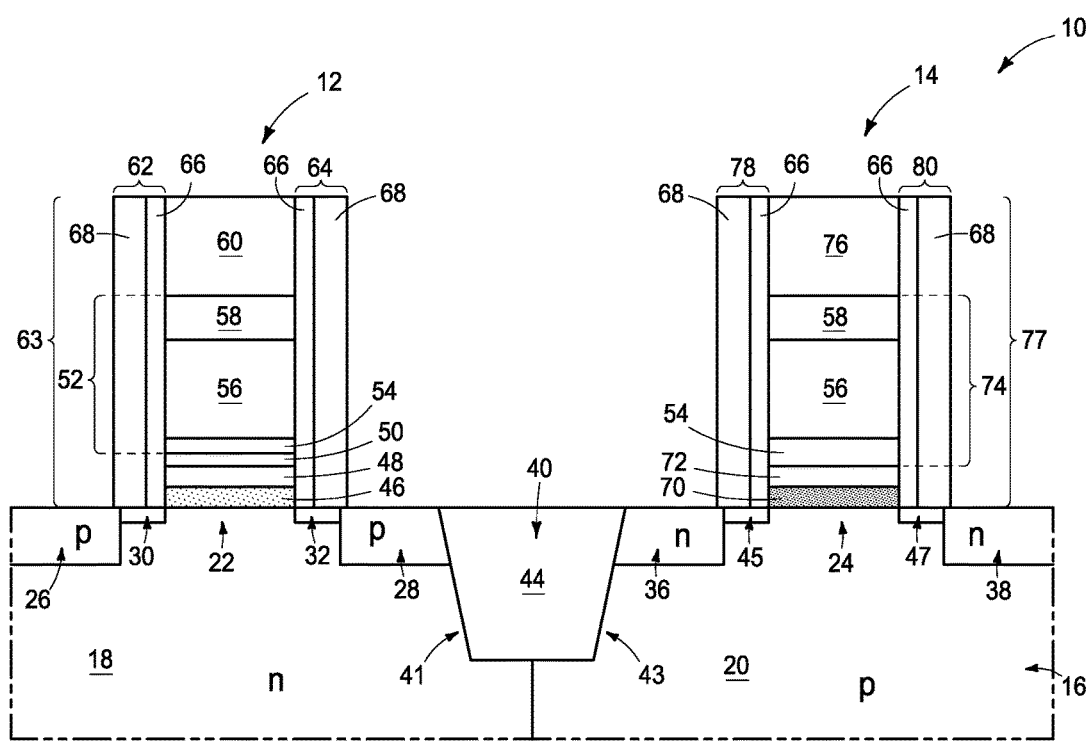
FIG. 1 is a diagrammatic cross-sectional view of a region of a semiconductor construction showing an example semiconductor device which includes a PMOS transistor adjacent an NMOS transistor.

FIG. 1 shows a region of a construction 10 illustrating an example CMOS. The CMOS includes a PMOS transistor (i.e., p-channel device) 12 and an NMOS transistor (i.e., n-channel device) 14, which are supported by a semiconductor substrate 16. In some embodiments the PMOS transistor 12 may be referred to as a first transistor of a first channel type, and the NMOS transistor 14 may be referred to as a second transistor of a second channel type.

The substrate 16 comprises an n-type doped region 18 adjacent a p-type doped region 20.

The substrate 16 may comprise semiconductor material; and may, for example, comprise, consist essentially of, or consist of monocrystalline silicon. The substrate 16 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications the substrate 16 may correspond to a semiconductor substrate containing one or more materials associated with integrated circuit fabrication. Such materials may include, for example, one or more of refractory metal materials, barrier materials, diffusion materials, insulator materials, etc.

The PMOS transistor 12 comprises a channel region 22 within the n-type doped region 18 of substrate 16; and the NMOS transistor 14 comprises a channel region 24 within the p-type doped region 20 of substrate 16.

The PMOS transistor 12 comprises heavily-doped source/drain regions 26 and 28 on opposing sides of the channel region 22, and comprises lightly-doped extension regions 30 and 32 between the heavily-doped source/regions 26/28 and the channel region 22. The heavily-doped source/drain regions 26/28 are majority doped with p-type dopant. The lightly-doped extension regions 30/32 may also be doped with p-type dopant, but to a lower concentration than the heavily-doped source/drain regions 26/28.

The NMOS transistor 14 comprises heavily-doped source/drain regions 36 and 38 on opposing sides of the channel region 24, and comprises lightly-doped extension regions 45 and 47 between the heavily-doped source/drain regions 36/38 and the channel region 24. The heavily-doped source/drain regions 36/38 are majority doped with n-type dopant. The lightly-doped extension regions 45/47 may also be doped with n-type dopant, but to a lower concentration than the heavily-doped source/drain regions 36/38.

An isolation region 40 is between the PMOS transistor 12 and the NMOS transistor 14. Specifically, the PMOS transistor 12 is on a first side 41 of the isolation region 40, and the NMOS transistor 14 is on a second side 43 of the isolation region 40; with the second side 43 being in opposing relation to the first side 41 along the illustrated cross-section of FIG. 1.

The isolation region 40 may comprise any suitable configuration. In the illustrated example, the isolation region is a trenched isolation region. The isolation region comprises an insulative material 44. Such material may comprise any suitable composition or combination of compositions; including, for example, one or more of silicon dioxide, silicon nitride, etc.

The PMOS transistor 12 comprises a nitrogen-doped gate dielectric layer 46 over the channel region 22. The nitrogen-doped gate dielectric layer 46 may be referred to as a PMOS gate dielectric layer in some embodiments, a first nitrogen-doped gate dielectric layer in some embodiments, or as a first nitrogen-doped dielectric layer in some embodiments. The nitrogen-doped gate dielectric layer 46 may comprise any suitable composition or combination of compositions; and in some embodiments may comprise silicon dioxide. For instance, the nitrogen-doped gate dielectric layer 46 may comprise, consist essentially of, or consist of silicon dioxide having nitrogen distributed therein. Nitrogen within the nitrogen-doped gate dielectric layer 46 is diagrammatically indicated by stippling.

Figure 14:
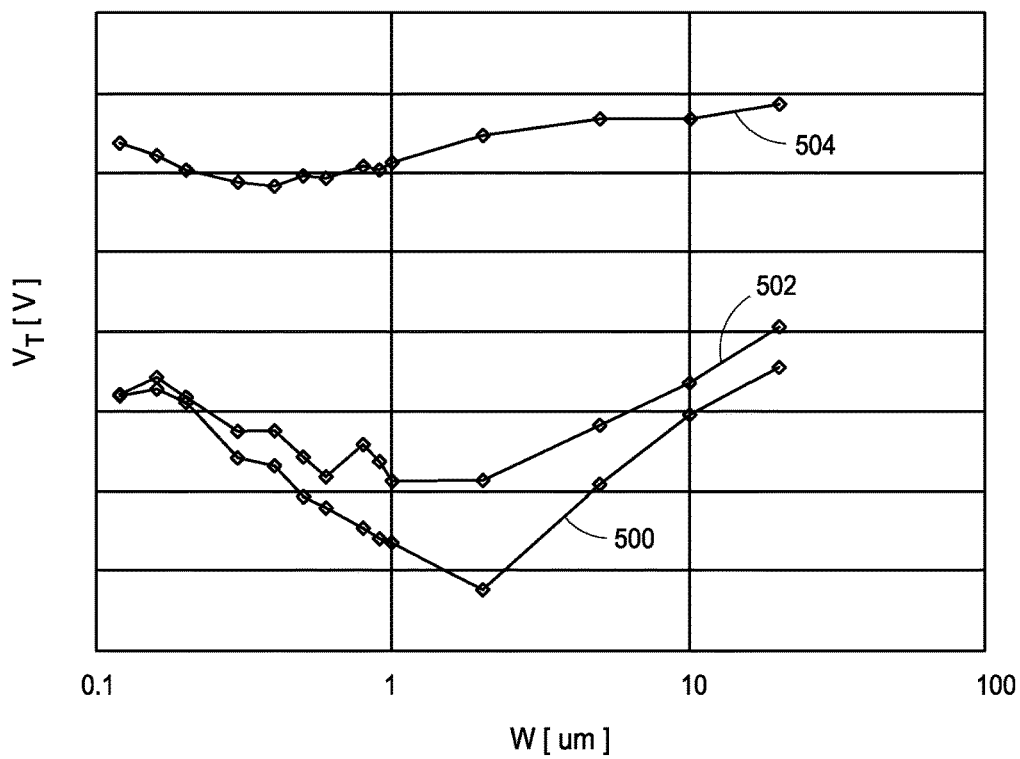
FIG. 14 is a graph of $V_T$ (measured in Volts (V)) versus width, "W", (measured in micrometers (μm)); and shows relationships of $V_T$ versus W with different levels of nitrogen concentration within gate dielectric material of PMOS transistors.

The nitrogen within the nitrogen-doped PMOS gate dielectric layer 46 may improve a relationship between threshold voltage ($V_T$) of the PMOS channel 22 and width of the PMOS channel 22, as discussed below with reference to FIG. 14.

The PMOS transistor 12 comprises a pair of additional dielectric materials 48 and 50 over the nitrogen-doped gate dielectric material 46. The dielectric materials 48 and 50 may comprise any suitable compositions or combinations of compositions; and may, for example, comprise high-k materials (where "high-k" means a higher dielectric constant than silicon dioxide). In some embodiments the materials 48 and 50 may be together referred to as a first high-k material. In some embodiments the dielectric material 48 may comprise, consist essentially of, or consist of hafnium oxide, and the dielectric material 50 may comprise, consist essentially of, or consist of aluminum oxide. The dielectric materials 48 and 50 may be formed to any suitable thicknesses. In some embodiments the dielectric material 48 may be formed to a thickness of about 2 nanometers (nm), and the dielectric material 50 may be formed to a thickness of about 0.5 nm. In some embodiments the dielectric materials 48 and 50 may both comprise an oxide, with the dielectric material 48 being a different oxide that the dielectric material 50. In such embodiments the dielectric materials 48 and 50 may be referred to as a first oxide and a second oxide, respectively. The dielectric materials 48 and 50 may be together referred to as a second dielectric layer in some embodiments.

The PMOS transistor 12 comprises a gate electrode 52 over the dielectric material 50. The gate electrode 52 comprises a first metal-containing composition 54, conductively-doped semiconductor material 56, and a second metal-containing composition 58. In some embodiments the first metal-containing composition 54 may comprise metal nitride (for instance, titanium nitride, tungsten nitride, etc.) and the second metal-containing composition 58 may comprise elemental metal (for instance, tungsten, titanium, cobalt, etc.). Although the gate electrode 52 is shown to comprise the three compositions 54, 56 and 58, in other embodiments the gate electrode 52 may comprise more than three conductive compositions or fewer than three conductive compositions. For instance, in some embodiments the composition 58 may be replaced with a multi-layer stack; which may comprise, for example, tungsten/tungsten silicide/titanium nitride and titanium in ascending order from the upper surface of the conductively-doped semiconductor material 56.

The metal-containing composition 54 may be formed to any suitable thickness, such as, for example, a thickness of about 7 nm.

The conductively-doped semiconductor material 56 may comprise any suitable semiconductor material; and in some embodiments may comprise, consist essentially of, or consist of appropriately-doped silicon. The conductively-doped semiconductor material 56 may be formed to any suitable thickness, such as, for example, a thickness of about 50 nm.

An insulative cap 60 is over the gate electrode 52. The insulative cap 60 may comprise any suitable composition or combination of compositions; and in some embodiments may comprise, consist essentially of, or consist of silicon nitride.

The nitrogen-doped gate dielectric layer 46, dielectric materials 48 and 50, gate electrode 52 and insulative cap 60 together form a PMOS transistor gate stack 63. Spacers 62 and 64 are along opposing sidewalls of the PMOS transistor gate stack 63. The spacers are shown comprising two layers 66 and 68, but in other embodiments may comprise a single layer, or more than two layers. The layers 66/68 may comprise any suitable compositions. For instance, the layer 66 may comprise, consist essentially of, or consist of silicon dioxide; and the layer 68 may comprise, consist essentially of, or consist of silicon nitride.

The NMOS transistor 14 comprises a nitrogen-doped gate dielectric layer 70 over the channel region 24. The nitrogen-doped gate dielectric layer 70 may be referred to as a nitrogen-doped NMOS gate dielectric layer in some embodiments, or as a second nitrogen-doped gate dielectric layer in some embodiments. The nitrogen-doped gate dielectric layer 70 may comprise any suitable composition or combination of compositions; and in some embodiments may comprise silicon dioxide. For instance, the nitrogen-doped gate dielectric layer 70 may comprise, consist essentially of, or consist of silicon dioxide having nitrogen distributed therein. The nitrogen is diagrammatically indicated by stippling. A total concentration of nitrogen within the nitrogen-doped NMOS gate dielectric layer 70 is higher than a total concentration of nitrogen within the nitrogen-doped PMOS gate dielectric layer 46, as indicated by the denser stippling within layer 70 as compared to layer 46. In some embodiments the nitrogen-doped NMOS gate dielectric layer 70 and the nitrogen-doped PMOS gate dielectric layer 46 may both comprise a same composition as one another (for instance, silicon dioxide), and may differ from one another in the level of nitrogen doping within such composition. The nitrogen-doped PMOS gate dielectric layer 46 and nitrogen-doped NMOS gate dielectric layer 70 may be formed to any suitable thicknesses; and may, for example, have thicknesses within a range of from about 1.8 nm to about 5.8 nm. The nitrogen-doped PMOS gate dielectric layer 46 and nitrogen-doped NMOS gate dielectric layer 70 may be about the same thickness as one another in some embodiments.

The nitrogen within the nitrogen-doped NMOS gate dielectric layer 70 may improve a $V_T$ of the NMOS channel 24, as discussed below with reference to FIGS. 30 and 31. The higher nitrogen concentration within the nitrogen-doped NMOS gate dielectric layer 70 as compared to the nitrogen-doped PMOS gate dielectric layer 46 may be advantageous in tailoring desired operational characteristics of both the NMOS transistor 14 and the PMOS transistor 12. The nitrogen-doped NMOS gate dielectric layer 70 may have a higher peak nitrogen concentration than the nitrogen-doped PMOS gate dielectric layer 46, in addition to having a higher overall nitrogen concentration than the nitrogen-doped PMOS gate dielectric layer 46, as discussed below with reference to FIG. 29.

The NMOS transistor 14 comprises an additional dielectric material 72 over the nitrogen-doped gate dielectric material 70. The dielectric material 72 may comprise any suitable composition or combination of compositions. In some embodiments the dielectric material 72 may comprise the same composition as the dielectric material 48; and accordingly may comprise, consist essentially of, or consist of hafnium oxide. The dielectric material 72 may be formed to any suitable thickness. In some embodiments the dielectric material 72 may be formed to a thickness of about 2 nanometers (nm). In some embodiments the dielectric material 72 may be referred to as a second high-k material.

The NMOS transistor 14 comprises a gate electrode 74 over the dielectric material 72. The gate electrode 74 of the NMOS transistor comprises the first metal-containing composition 54, conductively-doped semiconductor material 56, and second metal-containing composition 58 described above relative to the gate electrode 52 of the PMOS transistor. In other embodiments the gate electrode 74 of the NMOS transistor may comprise one or more different materials than the gate electrode 52 of the PMOS transistor.

Notably, in some embodiments the dielectric material 72 of the NMOS transistor 14 may be considered analogous to the dielectric material 48 of the PMOS transistor 12, and in such embodiments the NMOS transistor 14 may be considered to lack a dielectric material analogous to the dielectric material 50 of the PMOS transistor 12. In such embodiments, the dielectric material 50 may be considered to be an additional dielectric material which is present in the PMOS transistor 12 and not in the NMOS transistor 14. Alternatively, in some embodiments the PMOS transistor 12 may be considered to comprise aluminum oxide 50 and an additional oxide 48. In such embodiments, the NMOS transistor 14 may be considered to comprise oxide 72 corresponding to the additional oxide 48 of the PMOS transistor 12, and to lack the aluminum oxide of the PMOS transistor.

An insulative cap 76 is over the gate electrode 74. The insulative cap 76 may comprise any suitable composition or combination of compositions; and in some embodiments may comprise, consist essentially of, or consist of silicon nitride.

The nitrogen-doped gate dielectric layer 70, dielectric material 72, gate electrode 74 and insulative cap 76 together form an NMOS transistor gate stack 77. Spacers 78 and 80 are along opposing sidewalls of the NMOS transistor gate stack 77. The spacers are shown comprising the two layers 66 and 68, but in other embodiments may comprise a single layer, or more than two layers.

The example CMOS of FIG. 1 may be formed with any suitable methodology. An example method is described with reference to FIGS. 2-13.

Figure 2:
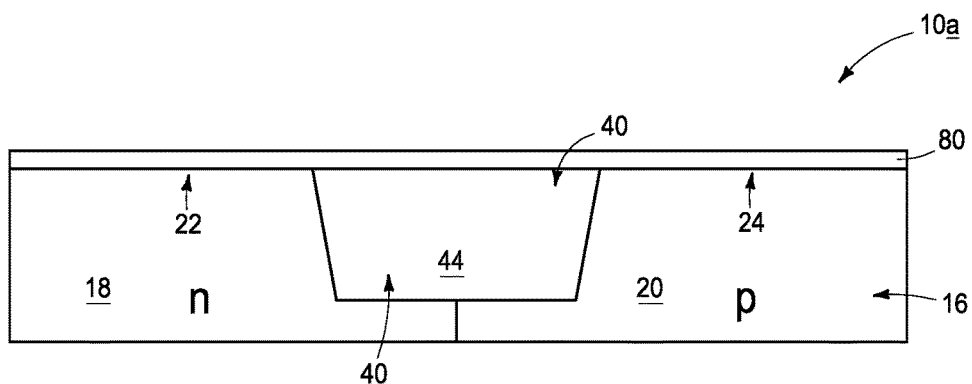
FIGS. 2-13 are diagrammatic cross-sectional views of a region of a semiconductor construction showing example process stages for forming an example embodiment semiconductor device.

Referring to FIG. 2, a construction 10a is shown to comprise the substrate 16 having the n-type region 18 and p-type region 20 provided therein.

The isolation region 40 is between the n-type region 18 and the p-type region 20, and comprises the insulative material 44. A location of the PMOS channel region 22 is within the n-type doped portion of substrate 16, and a location of the NMOS channel region 24 is within the p-type doped portion of substrate 16.

A gate dielectric layer 80 is formed to extend across the substrate 16 and the isolation region 40; and specifically is formed to extend across the location of the PMOS channel region 22, the location of the NMOS channel region 24, and the insulative material 44 of isolation region 40. The gate dielectric layer 80 may comprise any suitable composition or combination of compositions; and in some embodiments may comprise, consist essentially of, or consist of silicon dioxide. The gate dielectric layer 80 may be formed utilizing any suitable processing; including, for example, one or more of atomic layer deposition (ALD), chemical vapor deposition (CVD), in-situ steam generation (ISSG), etc.

Figure 3:
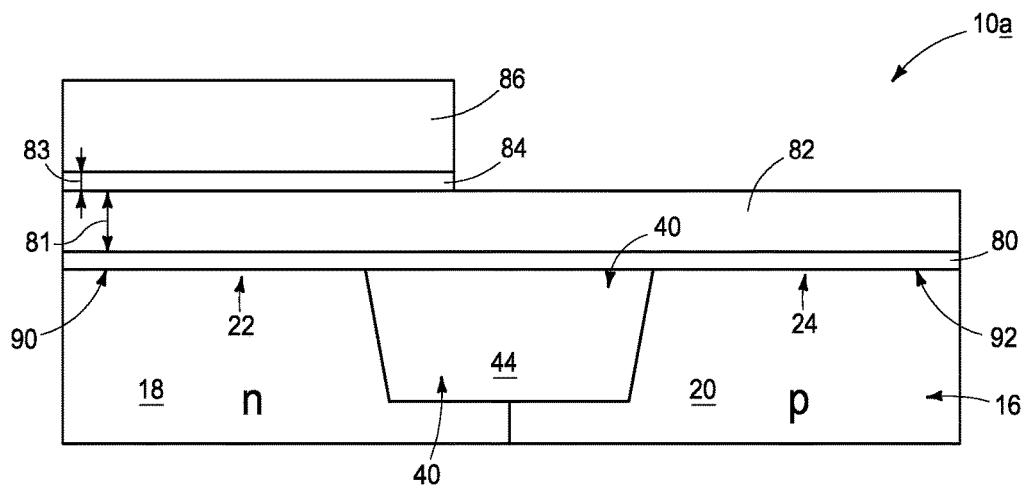

Referring to FIG. 3, a first masking layer 82 is formed over the gate dielectric layer 80, and a second masking layer 84 is formed over the first masking layer 82. The first masking layer 82 may comprise any suitable composition or combination of compositions; and in some embodiments may comprise, consist essentially of or consist of silicon (for instance, amorphous silicon). The second masking layer 84 may comprise any suitable composition or combination of compositions; and in some embodiments may comprise, consist essentially of, or consist of silicon dioxide. The masking layers 82 and 84 are formed to thicknesses 81 and 83, respectively. Such thicknesses may be any suitable thicknesses. For example, both of the thicknesses 81 and 83 may be within a range of from about 10 nm to about 50 nm. The thicknesses 81 and 83 may be the same as one another, or may be different from one another.

Patterned photoresist 86 is over the second masking layer 84. The photoresist 86 may be patterned utilizing any suitable methodology, including, for example, a KrF stepper without BARC (bottom antireflective coating). The patterned photoresist is utilized to pattern the second masking layer 84 into the configuration shown in FIG. 3. The patterning of the second masking layer 84 may be accomplished utilizing a dry etch selective for the material of layer 84 relative to the material of layer 82.

Figure 4:
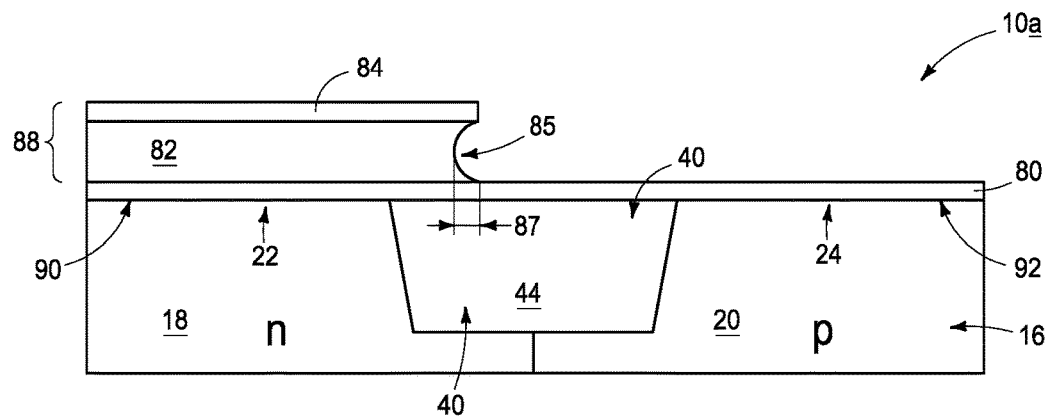

Referring to FIG. 4, the first masking layer 82 may be initially patterned utilizing a dry etch, and photoresist 86 (FIG. 3) may be removed. Subsequently, the first and second masking layers 82 and 84 may be exposed to a wet etch (for instance, an etch utilizing ammonium hydroxide). The wet etch insets a surface of the first masking layer 82 to form the recess 85. Such recess extends to a depth 87. Such depth may be of any suitable dimension; and in some embodiments may be within a range of from about 15 nm to about 30 nm.

The patterned masking layers 82 and 84 of FIG. 4 may be together considered to form a blocking mask 88 which extends across a region 90 of the gate dielectric layer 80. Another region 92 of the gate dielectric layer 80 is not covered by the blocking mask 88. The region 90 includes a portion of the gate dielectric layer 80 which will become nitrogen-doped PMOS gate dielectric material (shown in FIG. 13), and the region 92 includes a portion of the gate dielectric layer 80 which will become nitrogen-doped NMOS gate dielectric material (shown in FIG. 13).

Figure 5:
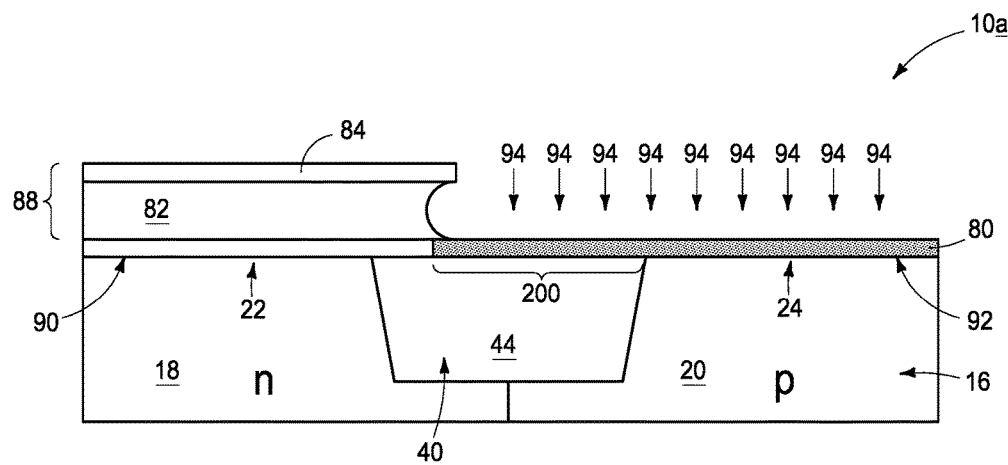

Referring to FIG. 5, nitrogen 94 is implanted into the exposed region 92 of gate dielectric layer 80, while the other region 90 of the gate dielectric layer 80 is protected by the blocking mask 88. The nitrogen 94 is implanted to a heavy dose to form a heavy concentration within the region 92 suitable for forming the nitrogen-doped NMOS gate dielectric material 70 described above with reference to FIG. 1. The nitrogen doping may utilize any suitable processing conditions; and in some embodiments may utilize a processing temperature within a range of from about 400° C. to about 600° C.; a pre-heat time within a range of from about zero seconds to about 60 seconds; a power within a range of from about 1500 watts (W) to about 2500 W, and a nitridation time of from about 50 seconds to about 70 seconds.

Figure 13:
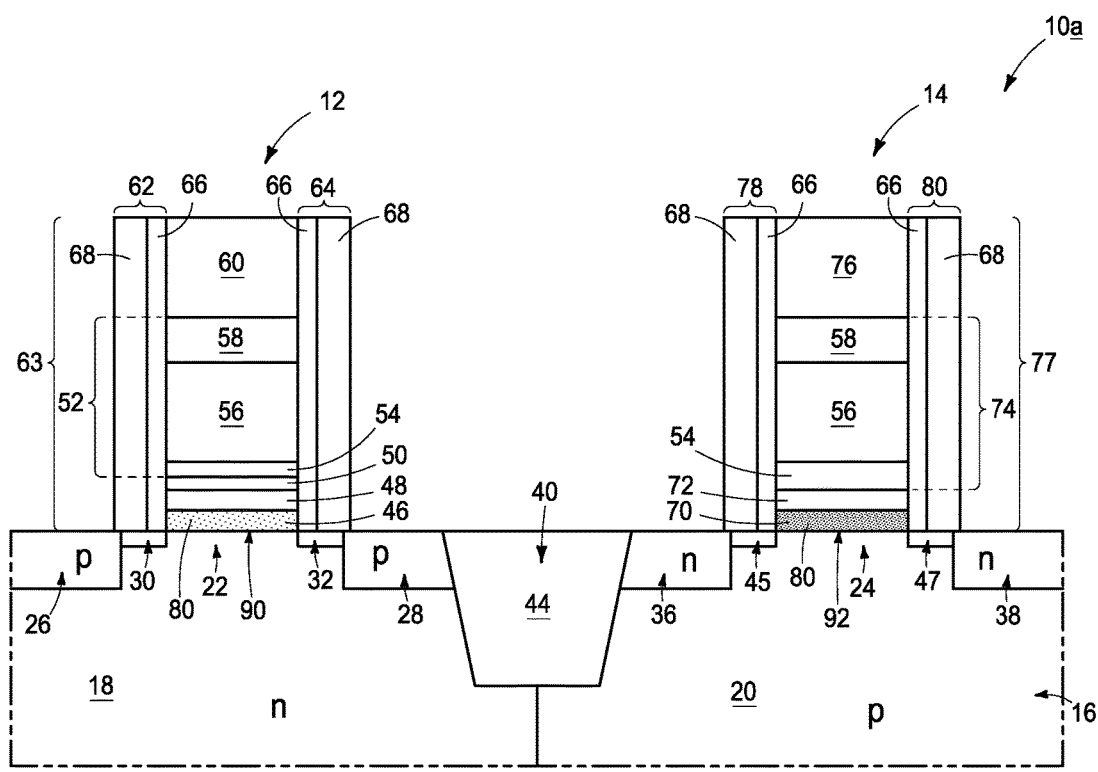

The heavily-doped region 92 of gate dielectric layer 80 includes a portion which will ultimately become the nitrogen-doped NMOS gate dielectric material 70 (as shown in FIG. 13).

In some embodiments, one of the regions 90 and 92 may be referred to as a first region of the gate dielectric layer 80, and the other may be referred to as a second region of the gate dielectric layer 80. The regions 90 and 92 are doped with different levels of nitrogen to eventually form a nitrogen-doped PMOS gate dielectric material 46 having a different nitrogen concentration than a nitrogen-doped NMOS gate dielectric material 70 (similar to the embodiment described above with reference to FIG. 1). Since the embodiment of FIG. 5 is doping the region 92 of gate dielectric layer 80 with a heavy concentration of nitrogen prior to the region 90 of the gate dielectric layer 80 being doped with a light concentration of nitrogen, the region 92 may be referred to as a first region of the gate dielectric layer 80 and the region 90 may be referred to as a second region of the gate dielectric layer 80. In other processing (for instance, processing described below with reference to FIGS. 16-27) the region 90 may be doped with a light concentration of nitrogen before the heavy concentration of nitrogen is provided within the region 92; and in such embodiments the region 90 may be referred to as the first region of the gate dielectric layer 80 and the region 92 may be referred to as the second region of the gate dielectric layer 80.

The embodiment of FIG. 5 shows the nitrogen-doped first region 92 of the gate dielectric layer 80 having a portion 200 extending across the isolation region 40; and in the shown embodiment such portion 200 extends more than halfway across an upper surface of the isolation region 40.

Figure 6:
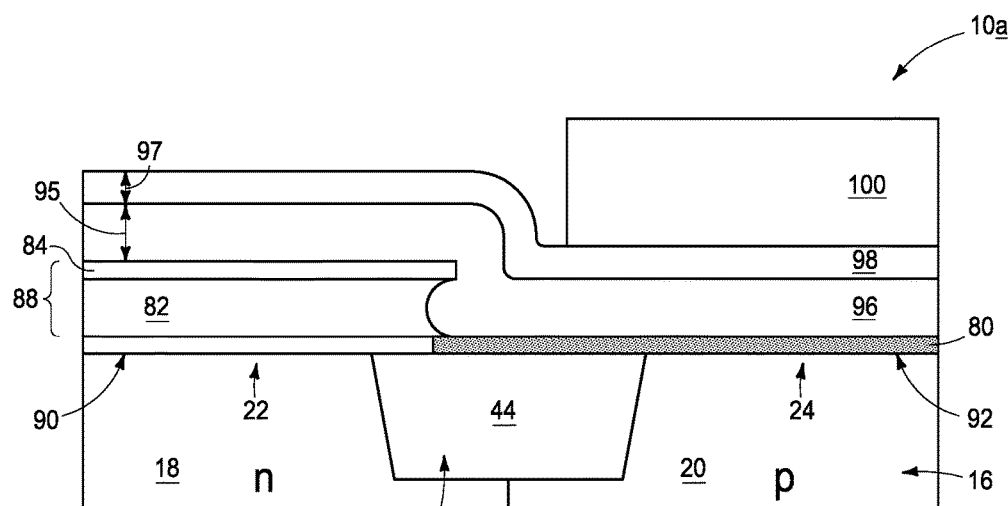

Referring to FIG. 6, a third masking material 96 is formed across the blocking mask 88 and the nitrogen-doped region 92 of gate dielectric layer 80, and a fourth masking layer 98 is formed across the third masking layer 96. The third masking layer 96 may comprise a same composition as the first masking layer 82; and accordingly may comprise, consist essentially of, or consist of silicon (for instance, amorphous silicon). The fourth masking layer 98 may comprise a same composition as the second masking layer 84; and accordingly may comprise, consist essentially of, or consist of silicon dioxide. An advantage of utilizing amorphous silicon within the third masking layer 96 is that such may alleviate or prevent out-diffusion of nitrogen atoms from the nitrogen-doped region 92 upwardly into masking materials above such nitrogen-doped region.

The masking layers 96 and 98 are formed to thicknesses 95 and 97, respectively. Such thicknesses may be any suitable thicknesses. For example, both of the thicknesses 95 and 97 may be within a range of from about 10 nm to about 50 nm. The thicknesses 95 and 97 may be the same as one another, or may be different from one another.

Patterned photoresist 100 is over the fourth masking layer 98. The photoresist 100 may be patterned utilizing any suitable methodology, including, for example, a KrF stepper.

Figure 7:
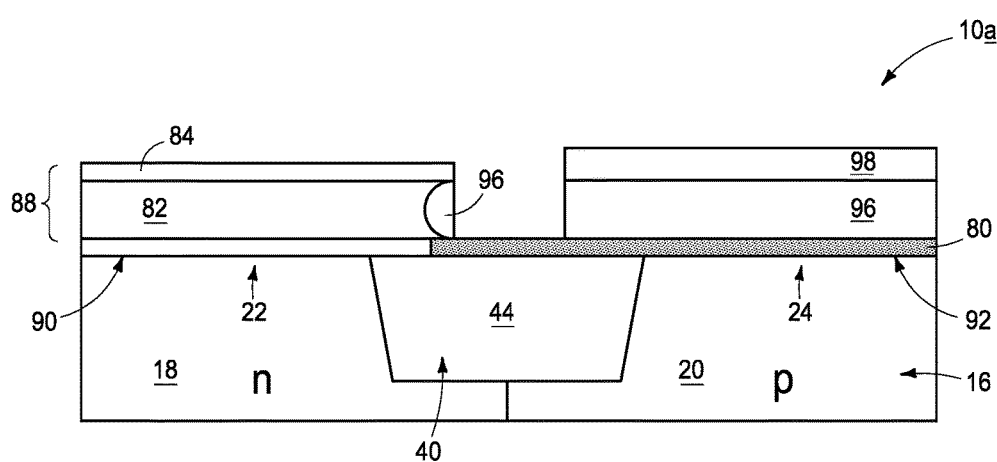

Referring to FIG. 7, the patterned photoresist 100 (FIG. 6) is utilized to pattern the fourth masking layer 98, and is then removed. The patterning of the fourth masking layer 98 may be accomplished utilizing a dry etch selective for the material of layer 98 relative to the material of layer 96. The third masking layer 96 may then be patterned utilizing a dry etch.

Figure 8:
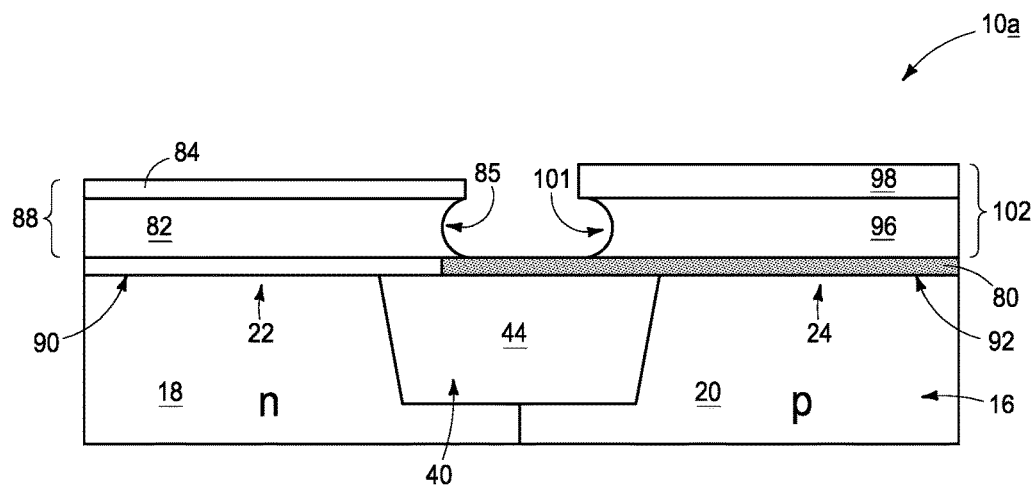

Referring to FIG. 8, a wet etch (for instance, an etch utilizing ammonium hydroxide) may be utilized to reopen the recess 85, and to form a similar recess 101 extending into the third masking layer 96.

The patterned masking layers 96 and 98 of FIG. 8 may be together considered to form a second mask 102 which extends across a portion of the nitrogen-doped region 92 of the gate dielectric layer 80.

Figure 9:
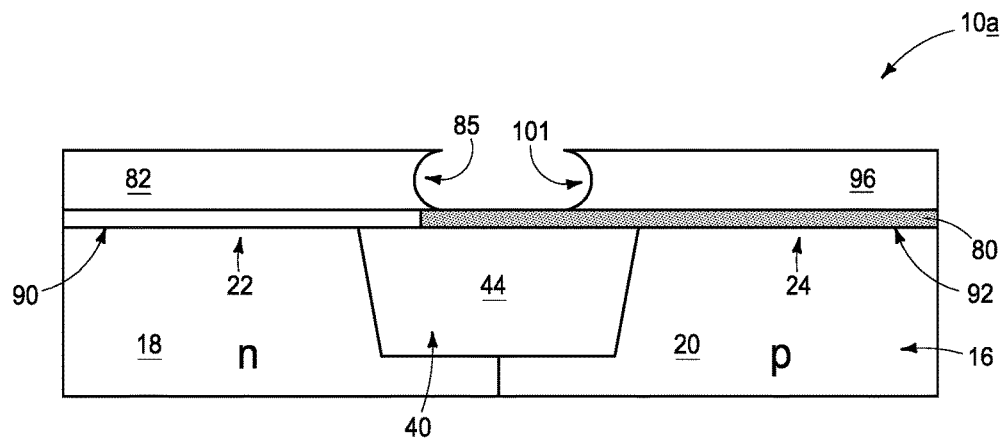

Referring to FIG. 9, masking layers 84 and 98 (FIG. 8) are removed. In embodiments in which the masking layers 84 and 98 comprise silicon dioxide, such removal may be accomplished utilizing hydrofluoric acid (for instance, dilute hydrofluoric acid (dHF)).

Figure 10:
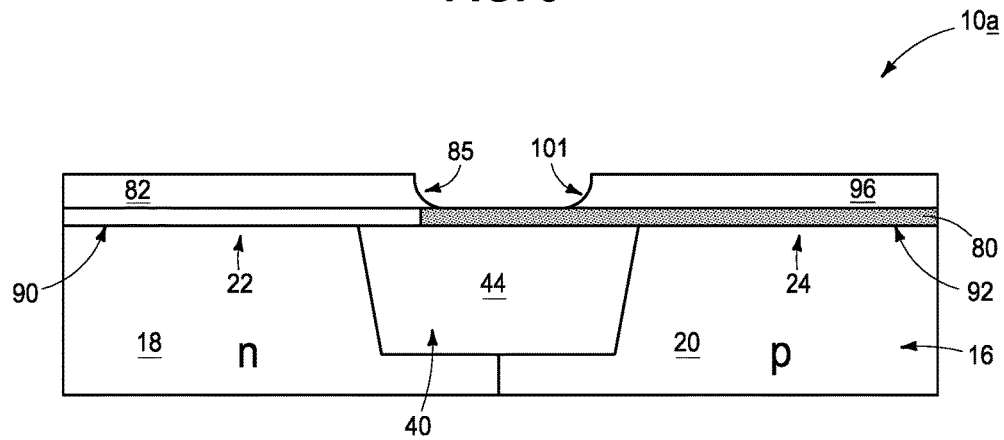

Referring to FIG. 10, upper surfaces of the masking layers 82 and 96 are exposed to a dry etch to thin the masking layers 82 and 96.

Figure 11:
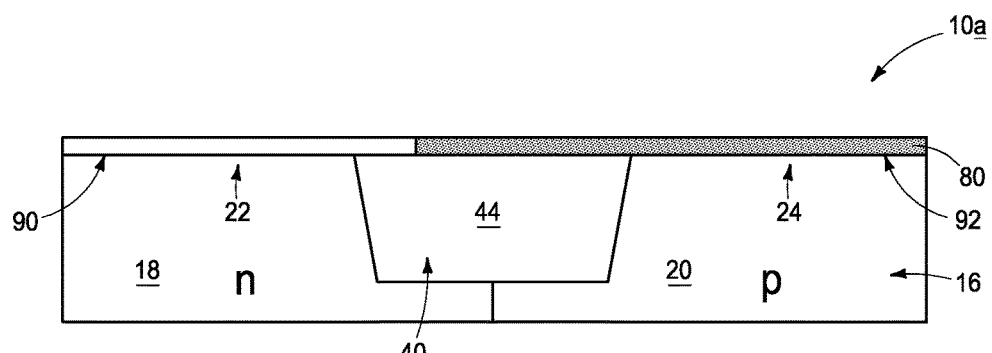

Referring to FIG. 11, the masking layers 82 and 96 (FIG. 10) are removed with a wet etch (for instance, an etch utilizing ammonium hydroxide).

Utilization of the dry etch of FIG. 10 in combination with the wet etch of FIG. 11 for removing the masking layers 82 and 96 may alleviate or prevent damage to the gate dielectric layer 80 that could otherwise occur if only dry etching conditions are utilized, or if only wet etching conditions are utilized. For instance, wet etching alone may require a long process time, which may undesirably reduce a thickness of some regions of the gate dielectric layer 80 and thereby undesirably influence $V_T$ of one or both of the PMOS gate dielectric material and the NMOS gate dielectric material formed from regions of the gate dielectric layer 80.

The combined steps of FIGS. 8-11 may be considered to simultaneously remove the blocking mask 88 (FIG. 8) and second mask 102 (FIG. 8), and to expose the nitrogen-doped region 92 of gate dielectric layer 80 and the region 90 (which may be referred to as a "second region") of the gate dielectric layer 80. Although the blocking mask 88 and second mask 102 (FIG. 8) are both shown to comprise two different masking layers in the illustrated embodiment (masking layers 82/84 of blocking mask 88, and masking layers 96/98 of second mask 102), in other embodiments the blocking mask 88 and second mask 102 may comprise more than two different masking layers or only a single masking layer.

Figure 12:
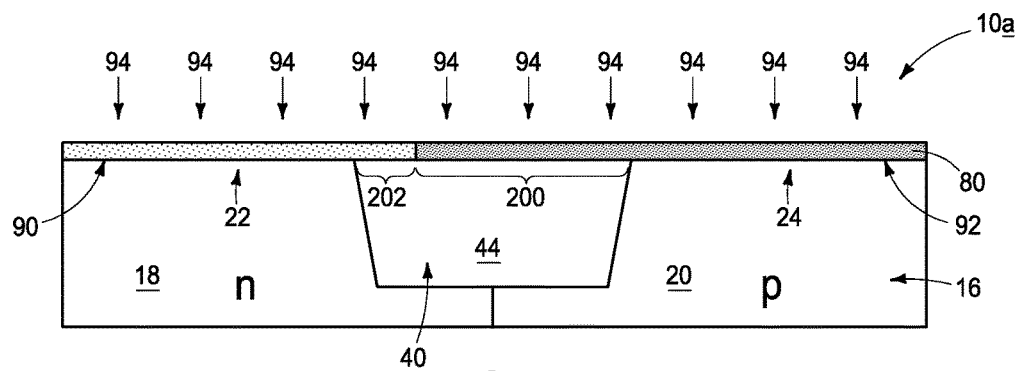

Referring to FIG. 12, nitrogen 94 is implanted into exposed regions 90 and 92 of the gate dielectric layer 80. The implant into exposed regions 90 and 92 may be referred to as a blanket implant of gate dielectric layer 80 in that the entirety of the gate dielectric layer 80 is exposed to the implant rather than having a portion of the gate dielectric layer 80 protected with a blocking mask.

The nitrogen 94 is provided in a light dose suitable to form the nitrogen-doped PMOS gate dielectric material 46 described above with reference to FIG. 1. Accordingly, the nitrogen implant of FIG. 12 may be provided for a shorter time and/or with less power as compared to the nitrogen implant described above with reference to FIG. 5.

The nitrogen doping of FIG. 12 may utilize any suitable processing conditions; and in some embodiments may utilize a processing temperature within a range of from about 400° C. to about 600° C.; a pre-heat time within a range of from about zero seconds to about 60 seconds; a power within a range of from about 1500 watts (W) to about 2500 W, and a nitridation time of from about 5 seconds to about 15 seconds.

The embodiment of FIG. 12 shows the nitrogen-doped second region 90 of gate dielectric layer 80 having a portion 202 extending over the isolation region 40. The portion 202 abuts against the portion 200 of the nitrogen-doped first region 92 of gate dielectric layer 80. In some embodiments the portion 200 of the nitrogen-doped first region 92 may be referred to as a first portion, and the portion 202 of the nitrogen-doped second region 90 may be referred to as a second portion.

Referring to FIG. 13, the first and second portions 200/202 of nitrogen-doped first and second regions 92/90 are removed. A remaining portion of the nitrogen-doped region 90 of gate dielectric layer 80 becomes the nitrogen-doped gate dielectric material 46 of a PMOS transistor 12 analogous to that described above with reference to FIG. 1, and a remaining portion of the nitrogen-doped region 92 of gate dielectric layer 80 becomes the nitrogen-doped gate dielectric material 70 of an NMOS transistor 14 analogous to that described above with reference to FIG. 1. Specifically, a gate stack 63 corresponding to a PMOS gate is formed over the nitrogen-doped region 90, and may be utilized to pattern the region 90 into the nitrogen-doped PMOS gate dielectric material 46. The source/drain regions 26/28 and extension regions 30/32 are formed on opposing sides of the nitrogen-doped PMOS gate dielectric material 46. Similarly, a gate stack 68 corresponding to an NMOS gate is formed over the nitrogen-doped region 92, and may be utilized to pattern the region 92 into the nitrogen-doped NMOS gate dielectric material 70. The source/drain regions 36/38 and extension regions 45/47 are formed on opposing sides of the nitrogen-doped NMOS gate dielectric material 70.

The nitrogen-doped PMOS gate dielectric material 46 of FIG. 13 may provide advantages relative to conventional PMOS gate dielectric materials lacking nitrogen doping. For instance, FIG. 14 graphically compares relationships between $V_T$ and channel width for PMOS transistors having different levels of nitrogen doping within the PMOS gate dielectric material. A lower curve 500 shows the relationship between $V_T$ and channel width for a PMOS transistor which lacks nitrogen doping within the PMOS gate dielectric material. The curve 500 shows an undesired "V" shape. A middle curve 502 shows a relationship with weak nitridation of the PMOS gate dielectric (i.e., nitridation to a total concentration within the PMOS gate dielectric within a range of from about greater than 5 atomic percent to less than or equal to about 20 atomic percent). The middle curve shows desired behavior of the PMOS gate dielectric. An upper curve 504 shows a relationship with heavy nitridation of the PMOS gate dielectric (i.e., nitridation within the PMOS gate dielectric to a total concentration of greater than or equal to about 33 atomic percent). The upper curve shows undesired behavior of the PMOS gate dielectric, but corresponds to a nitridation level suitable for utilization in the nitrogen-doped NMOS gate dielectric 70.

Figure 15:
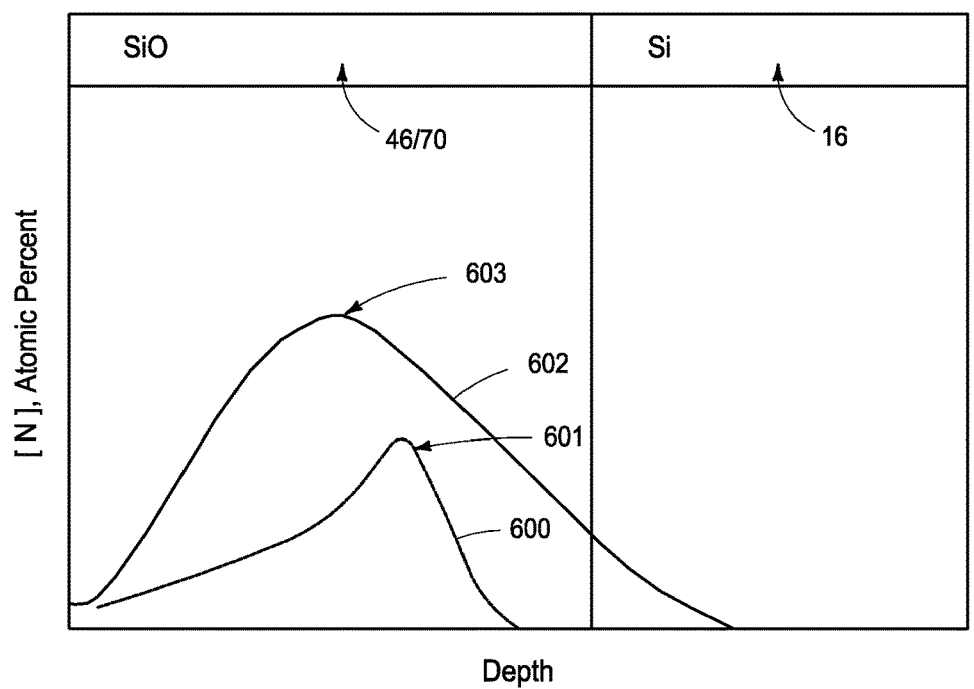
FIG. 15 is a graph of nitrogen concentration, [N], (measured in atomic percent) versus depth relative to an example PMOS transistor and an example NMOS transistor shown in FIG. 13. The graph shows a gate dielectric region (labeled "SiO") and a substrate region (labeled "Si"), and an interface between such regions.

FIG. 15 graphically illustrates example nitrogen concentration and distribution within the PMOS and NMOS gate dielectric materials 46/70, with the nitrogen concentration [N] being measured in atomic percent. FIG. 15 also shows a region of the substrate 16. The gate dielectric materials 46/70 are indicated to comprise silicon oxide (SiO) and the substrate is indicated to comprise Si. In other embodiments the gate dielectric materials 46/70 may comprise other suitable dielectric materials, and/or the substrate may comprise other suitable semiconductor materials.

FIG. 15 shows a lower curve 600 corresponding to the example distribution of nitrogen within nitrogen-doped PMOS gate dielectric material 46, and shows an upper curve 602 corresponding to the example distribution of nitrogen within the nitrogen-doped NMOS gate dielectric material 70. Comparing the curves 600 and 602, it is noted that the overall amount of nitrogen within nitrogen-doped NMOS gate dielectric material 70 is substantially higher than the overall amount of nitrogen within nitrogen-doped PMOS gate dielectric material 46, and that the peak concentration of nitrogen within nitrogen-doped NMOS gate dielectric material 70 (identified by a peak 603 along curve 602) is substantially greater than a peak concentration of nitrogen within the nitrogen-doped PMOS gate dielectric material 46 (identified by a peak 601 along curve 600). In some embodiments the peak concentration of nitrogen within the nitrogen-doped NMOS gate dielectric material 70 may be located within an area from a bottom surface of the nitrogen-doped gate dielectric material 70 to a height of about 1 nanometer (nm); and the peak concentration of nitrogen within the nitrogen-doped PMOS gate dielectric material 46 also may be located within an area from a bottom surface of the nitrogen-doped gate dielectric material 46 to a height of about 1 nm.

The total concentration of nitrogen within the nitrogen-doped PMOS gate dielectric material 46 may be referred to as a first concentration, and the total concentration of nitrogen within the nitrogen-doped NMOS gate dielectric material 70 may be referred to as a second concentration. The second concentration may be greater than the first concentration by any suitable amount; and in some embodiments may be greater than the first concentration by at least about 30%.

Another example method for fabricating the example CMOS of FIG. 1 is described with reference to FIGS. 16-27.

Figure 16:
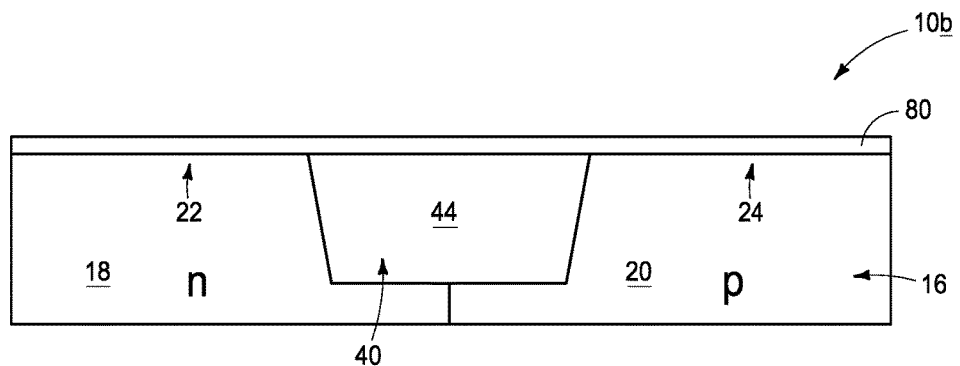
FIGS. 16-27 are diagrammatic cross-sectional views of a region of a semiconductor construction showing example process stages for forming an example embodiment semiconductor device.

Referring to FIG. 16, a construction 10b is shown to comprise the substrate 16 having the n-type region 18 and p-type region 20 provided therein.

The isolation region 40 is between the n-type region 18 and the p-type region 20, and comprises the insulative material 44. A location of the PMOS channel region 22 is within the n-type doped portion of substrate 16, and a location of the NMOS channel region 24 is within the p-type doped portion of substrate 16.

The gate dielectric layer 80 is formed to extend across the substrate 16 and the isolation region 40; and specifically is formed to extend across the location of the PMOS channel region 22, the location of the NMOS channel region 24, and the insulative material 44 of isolation region 40. The gate dielectric layer 80 may comprise, consist essentially of, or consist of silicon dioxide, and may be formed utilizing any suitable processing; including, for example, one or more of ALD, CVD, ISSG, etc.

Figure 17:
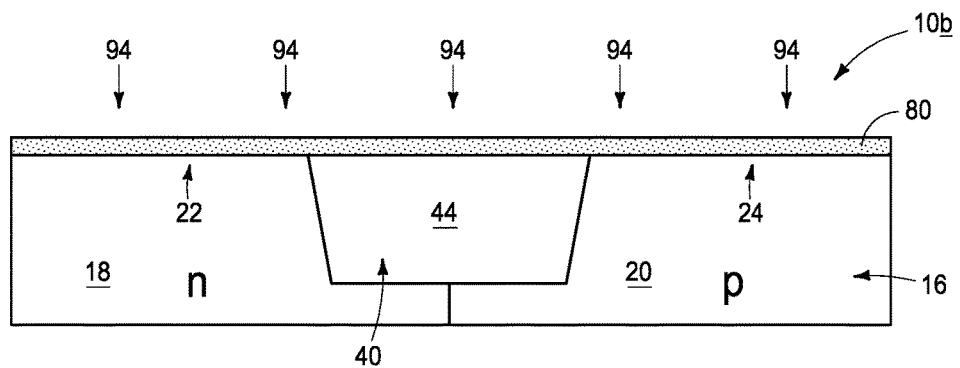

Referring to FIG. 17, nitrogen 94 is blanket implanted across an entirety of the gate dielectric layer 80. The nitrogen 94 is provided in a light dose suitable to form the nitrogen-doped PMOS gate dielectric material 46 described above with reference to FIG. 1, and accordingly may be implanted utilizing the conditions described above with reference to FIG. 12. Plasma nitridation may produce both thermally stable Si—N bonds and unstable O—N bonds, and the weak plasma nitridation utilized during the illustrated blanket implant may be coupled with a thermal process in which heat is applied to create a state in which only thermally stable Si—N bonds are present.

Figure 18:
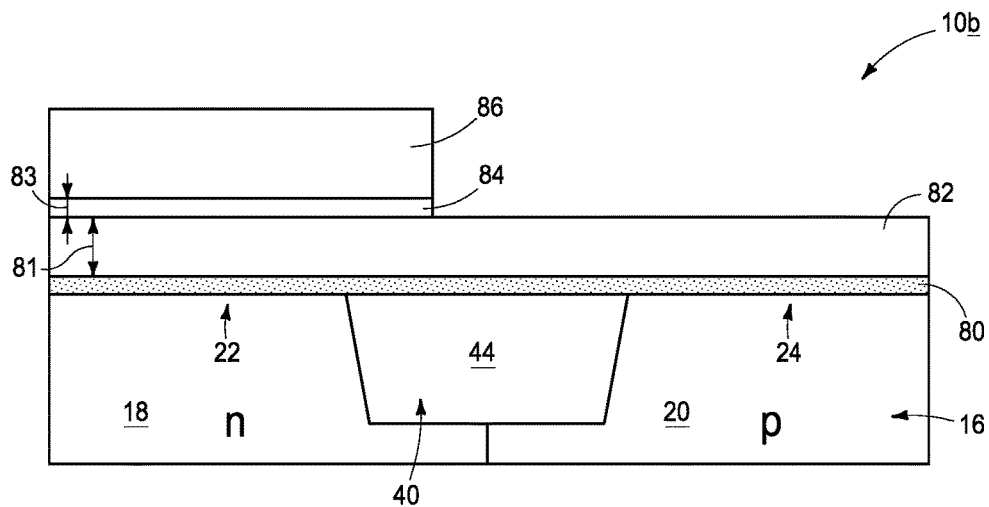

Referring to FIG. 18, the first masking layer 82 is formed over the gate dielectric layer 80, and the second masking layer 84 is formed over the first masking layer 82. The first and second masking layers 82/84 may comprise the compositions described above with reference to FIG. 3. The masking layers 82 and 84 are formed to thicknesses 81 and 83, respectively. Such thicknesses may be the same as those described above with reference to FIG. 3.

Patterned photoresist 86 is over the second masking layer 84. The photoresist 86 may be patterned utilizing any suitable methodology, including, for example, a KrF stepper. The patterned photoresist is utilized to pattern the second masking layer 84 into the configuration shown in FIG. 18. The patterning of the second masking layer 84 may be accomplished utilizing a dry etch selective for the material of layer 84 relative to the material of layer 82.

Figure 19:
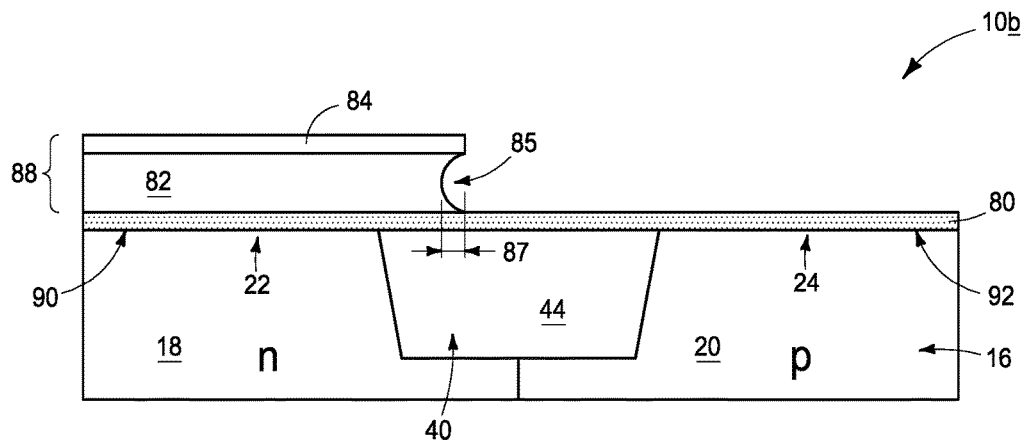

Referring to FIG. 19, the first masking layer 82 may be initially patterned utilizing a dry etch, and photoresist 86 (FIG. 18) may be removed. Subsequently, the first and second masking layers 82 and 84 may be exposed to a wet etch (for instance, an etch utilizing ammonium hydroxide). The wet etch insets a surface of the first masking layer 82 to form the recess 85. Such recess extends to the depth 87. Such depth may be of any suitable dimension; and in some embodiments may be within the range of from about 15 nm to about 30 nm.

The patterned masking layers 82 and 84 of FIG. 19 may be together considered to form the blocking mask 88 which extends across the region 90 of the gate dielectric layer 80, and the region 92 of the gate dielectric layer 80 is not covered by the blocking mask 88. The embodiment of FIG. 19 is similar to that of FIG. 4, except that region 90 is already lightly-doped with nitrogen in the embodiment of FIG. 19 and was not yet doped with nitrogen in the embodiment of FIG. 4.

Figure 20:
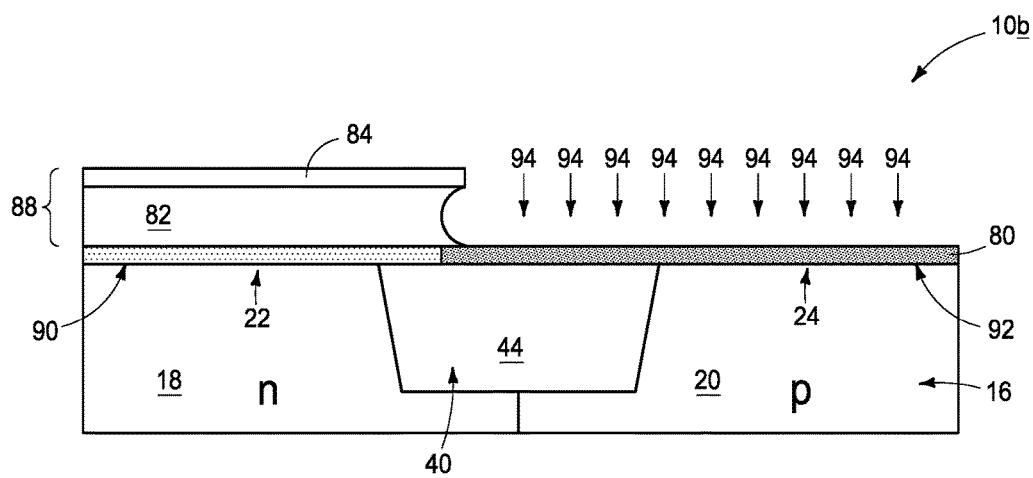

Referring to FIG. 20, nitrogen 94 is implanted into the exposed region 92 of gate dielectric layer 80, while the other region 90 of the gate dielectric layer 80 is protected by the blocking mask 88. The nitrogen 94 is implanted to a heavy dose to form the heavy concentration within region 92 suitable for forming the nitrogen-doped NMOS gate dielectric material 70 described above with reference to FIG. 1. The nitrogen doping may utilize the example processing conditions described above with reference to FIG. 5.

In the embodiment of FIGS. 16-20, the region 90 of gate dielectric layer 80 is doped with the light concentration nitrogen prior to the doping of the region 92 of gate dielectric layer 80 with the heavy concentration of nitrogen, which is an opposite sequence relative to the embodiment described above with reference to FIGS. 2-12. Accordingly, whereas the description of the embodiment of FIGS. 2-12 refers to region 92 as a first region of the gate dielectric layer 80, and refers to region 90 as a second region of the gate dielectric layer 80, due to region 92 being doped with nitrogen prior to region 80; the region 90 may be referred to as a first region of the gate dielectric layer 80 and the region 92 may be referred to as a second region of the gate dielectric layer 80 in the description of the embodiment of FIGS. 16-20 due to the region 90 being lightly-doped with nitrogen prior to the region 92 being heavily-doped with nitrogen.

Figure 27:
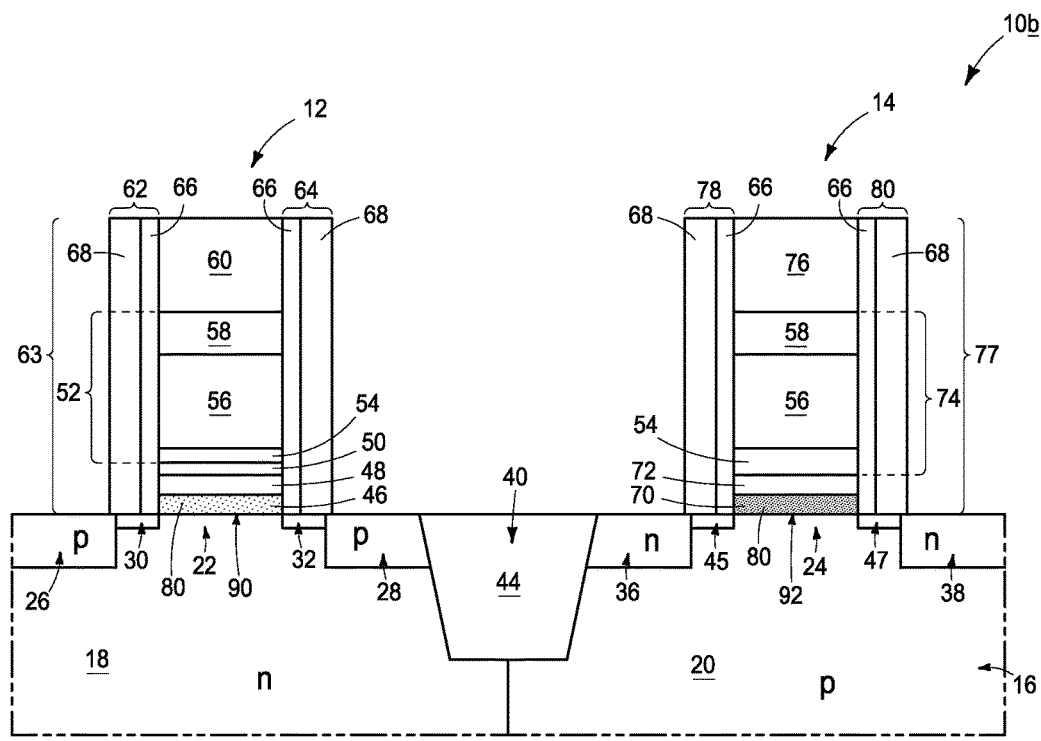

The lightly-doped region 90 of the dielectric layer 80 includes a portion which will ultimately become the nitrogen-doped PMOS gate dielectric material 46 (as shown in FIG. 27), and the heavily-doped region 92 of the gate dielectric layer 80 includes a portion which will ultimately become the nitrogen-doped NMOS gate dielectric material 70 (as shown in FIG. 27).

Figure 21:
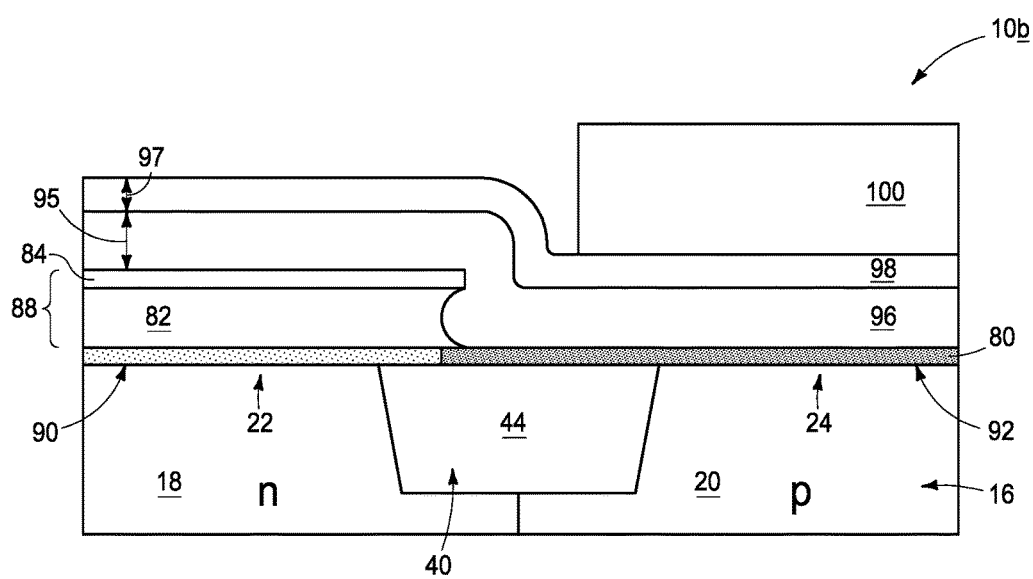

Referring to FIG. 21, the third masking material 96 is formed across the blocking mask 88 and the nitrogen-doped region 92 of the gate dielectric layer 80, and the fourth masking layer 98 is formed across the third masking layer 96. The third and fourth masking layers 96/98 may comprise the compositions described above with reference to FIG. 6.

The masking layers 96 and 98 are formed to thicknesses 95 and 97, respectively, which may be the same as the thicknesses described above with reference to FIG. 6.

The patterned photoresist 100 is over the fourth masking layer 98. The photoresist 100 may be patterned utilizing any suitable methodology, including, for example, a KrF stepper.

Figure 22:
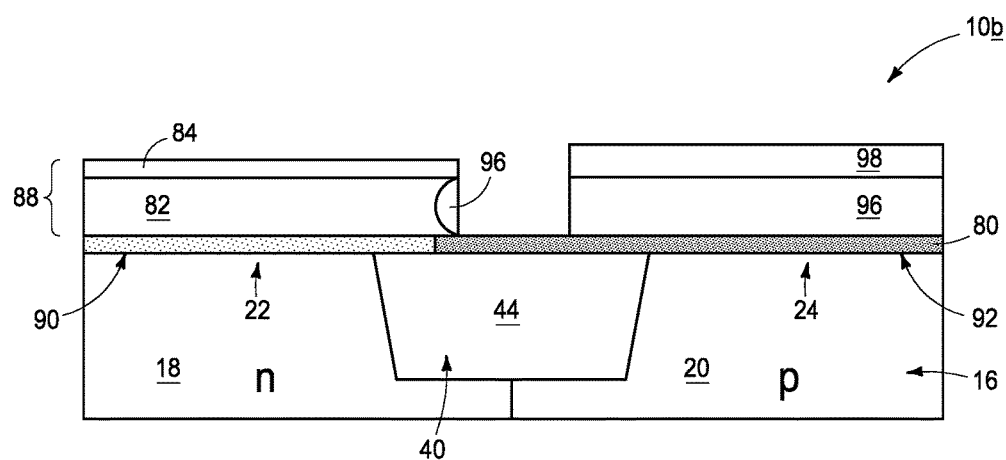

Referring to FIG. 22, the patterned photoresist 100 (FIG. 21) is utilized to pattern the fourth masking layer 98, and is then removed. The patterning of the fourth masking layer 98 may be accomplished utilizing a dry etch selective for the material of layer 98 relative to the material of layer 96. The third masking layer 96 may then be patterned utilizing a dry etch.

Figure 23:
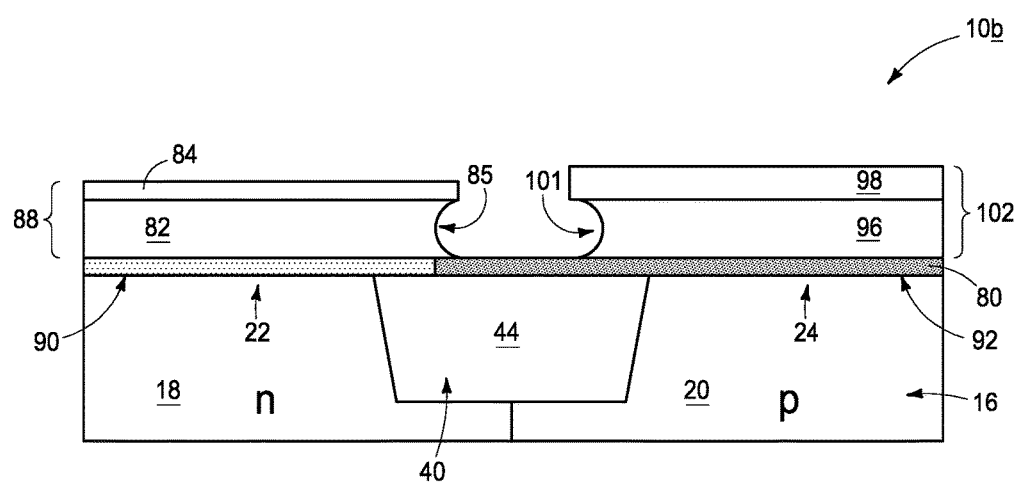

Referring to FIG. 23, a wet etch (for instance, an etch utilizing ammonium hydroxide) may be utilized to reopen the recess 85, and to form a similar recess 101 extending into the third masking layer 96.

The patterned masking layers 96 and 98 of FIG. 23 may be together considered to form the second mask 102 which extends across a portion of the nitrogen-doped region 92 of the gate dielectric layer 80.

Figure 24:
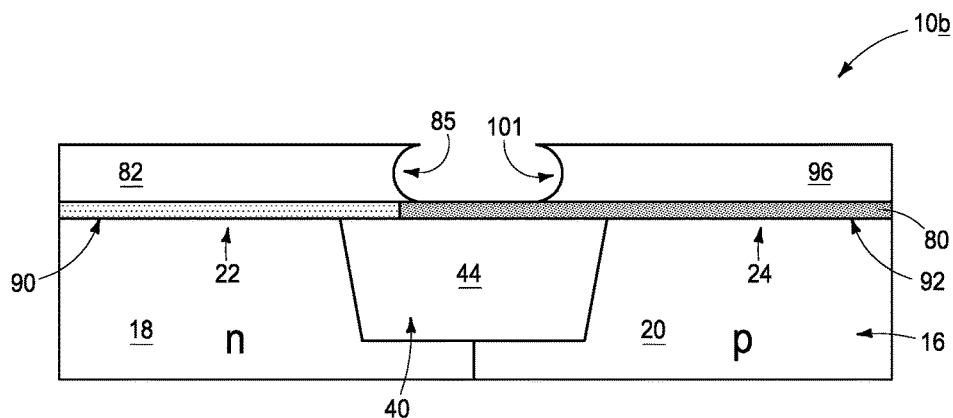

Referring to FIG. 24, masking layers 84 and 98 (FIG. 23) are removed. In embodiments in which the masking layers 84 and 98 comprise silicon dioxide, such removal may be accomplished utilizing hydrofluoric acid (for instance, dilute hydrofluoric acid (dHF)).

Figure 25:
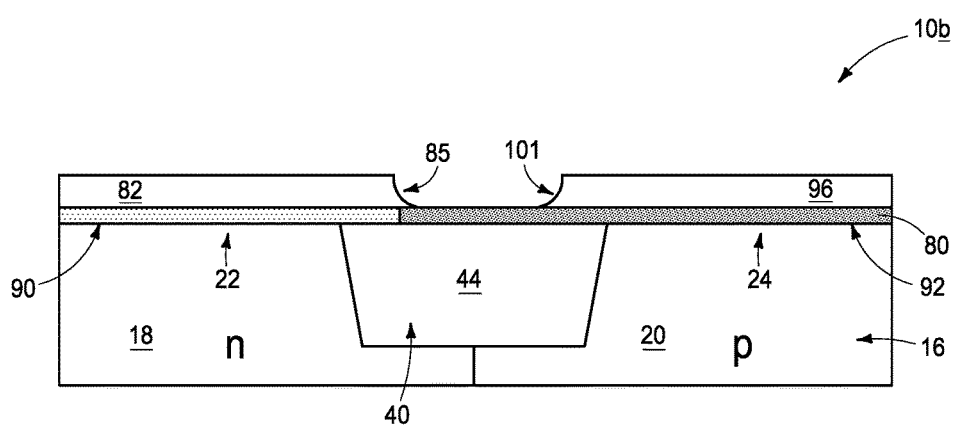

Referring to FIG. 25, upper surfaces of the masking layers 82 and 96 are exposed to a dry etch to thin the masking layers 82 and 96.

Figure 26:
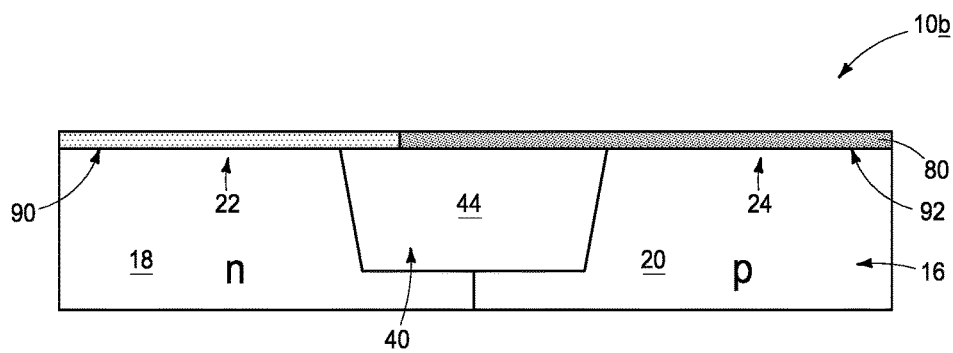

Referring to FIG. 26, the masking layers 82 and 96 (FIG. 25) are removed with a wet etch (for instance, an etch utilizing ammonium hydroxide).

Utilization of the dry etch of FIG. 25 in combination with the wet etch of FIG. 26 for removing the masking layers 82 and 96 may alleviate or prevent damage to the gate dielectric layer 80 that could otherwise occur if only dry etching conditions are utilized, or if only wet etching conditions are utilized, as discussed above with reference to FIG. 11.

The combined steps of FIGS. 23-26 may be considered to simultaneously remove the blocking mask 88 (FIG. 23) and second mask 102 (FIG. 23) to expose the first and second nitrogen-doped regions 90/92 of gate dielectric layer 80.

Referring to FIG. 27, a portion of the nitrogen-doped region 90 of gate dielectric layer 80 becomes the nitrogen-doped gate dielectric material 46 of a PMOS transistor 12 analogous to that described above with reference to FIG. 1, and a portion of the nitrogen-doped region 92 of gate dielectric layer 80 becomes the nitrogen-doped gate dielectric material 70 of an NMOS transistor 14 analogous to that described above with reference to FIG. 1. Specifically, a gate stack 63 corresponding to a PMOS gate is formed over the nitrogen-doped region 90, and may be utilized to pattern the region 90 into the nitrogen-doped PMOS gate dielectric material 46. The source/drain regions 26/28 and extension regions 30/32 are formed on opposing sides of the nitrogen-doped PMOS gate dielectric material 46. Similarly, a gate stack 68 corresponding to an NMOS gate is formed over the nitrogen-doped region 92, and may be utilized to pattern the region 92 into the nitrogen-doped NMOS gate dielectric material 70. The source/drain regions 36/38 and extension regions 45/47 are formed on opposing sides of the nitrogen-doped NMOS gate dielectric material 70.

The nitrogen-doped PMOS gate dielectric material 46 of FIG. 27 may provide the same advantages described above with reference to FIG. 14.

Figure 28:
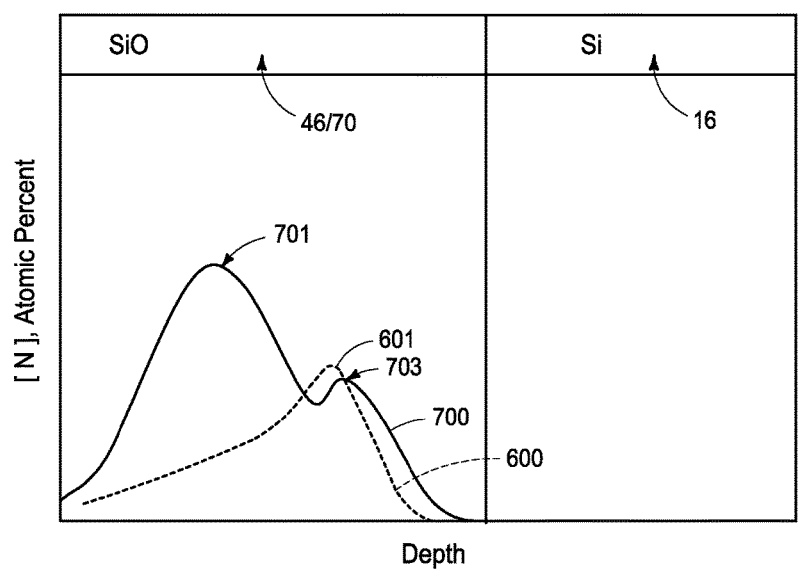
FIG. 28 is a graph of nitrogen concentration, [N], (measured in atomic percent) versus depth relative to an example PMOS transistor and an example NMOS transistor shown in FIG. 27. The graph shows a gate dielectric region (labeled "SiO") and a substrate region (labeled "Si"), and an interface between such regions.

FIG. 28 graphically illustrates example nitrogen concentration and distribution within the PMOS and NMOS gate dielectric materials 46/70 (with the nitrogen concentration [N] being measured in atomic percent), for the embodiment of FIG. 27. FIG. 28 also shows a region of the substrate 16. The gate dielectric materials 46/70 are indicated to comprise silicon oxide (SiO) and the substrate is indicated to comprise Si. In other embodiments the gate dielectric materials 46/70 may comprise other suitable dielectric materials, and/or the substrate may comprise other suitable semiconductor materials.

FIG. 28 shows a lower curve 600 corresponding to the example distribution of nitrogen within the nitrogen-doped PMOS gate dielectric material 46, and shows an upper curve 700 corresponding to the example distribution of nitrogen within the nitrogen-doped NMOS gate dielectric material 70. The lower curve 600 (i.e., the distribution within the nitrogen-doped PMOS gate dielectric material 46) approximately matches the same lower curve 600 shown in FIG. 15, which pertains to the earlier embodiment described with reference to FIGS. 2-13. In contrast, the upper curve 700 (i.e., the distribution within the nitrogen-doped NMOS gate dielectric material 70) is markedly different from the upper curve 602 of FIG. 15.

The upper curve 700 of FIG. 28 shows that the nitrogen is substantially entirely contained within the nitrogen-doped NMOS gate dielectric material 70 in the embodiment of FIGS. 16-27, whereas the upper curve 602 of FIG. 15 shows that some nitrogen spills from the nitrogen-doped NMOS gate dielectric material 70 into the substrate 16 in the embodiment of FIGS. 2-13. Accordingly, the embodiment of FIGS. 16-27 may be preferred over that of FIGS. 2-13. The nitrogen may be contained within the nitrogen-doped NMOS gate dielectric material 70 in the embodiment of FIGS. 16-27 due to the nitrogen provided in the blanket implant of FIG. 17 functioning as a barrier layer to suppress the diffusion of nitrogen into an underlying substrate 16 during the high concentration plasma nitridation process of FIG. 20.

The upper curve 700 of FIG. 28 also shows that the nitrogen distribution within the nitrogen-doped NMOS gate dielectric material 70 has two peak concentrations; with a lower peak concentration 703 resulting from the blanket implant of nitrogen at the processing stage of FIG. 17, and the higher peak concentration 701 resulting from the high-concentration doping at the processing stage of FIG. 20. Notably, the peak 703 of the nitrogen distribution within the nitrogen-doped NMOS gate dielectric material 70 may be lower than the peak 601 of the nitrogen distribution within the nitrogen-doped PMOS gate dielectric material 46, even though both peaks result from the same blanket implant of nitrogen at the processing stage of FIG. 17. Such may be due to diffusion of nitrogen within the NMOS gate dielectric material due to impact of nitrogen into such NMOS gate dielectric material during the subsequent heavy nitrogen implant occurring at the processing stage of FIG. 20. In some embodiments, the nitrogen-doped PMOS gate dielectric material 46 may be considered to be a first nitrogen-doped gate dielectric layer (as discussed above with reference to FIG. 1), and the nitrogen-doped NMOS gate dielectric material 70 may be considered to be a second nitrogen-doped gate dielectric layer (as discussed above with reference to FIG. 1). The second nitrogen-doped NMOS gate dielectric material 70 may be considered to comprise a second peak concentration of nitrogen (the peak concentration 701 of FIG. 28) and a third peak nitrogen concentration (the peak concentration 703 of FIG. 28). In such embodiments the nitrogen-doped PMOS gate dielectric material 46 may be considered to comprise a first peak concentration of nitrogen (the peak 601 of FIG. 28) which is greater than the third peak concentration (703) and smaller than the second peak concentration (701).

Comparing the curves 700 and 600, it is noted that the overall amount of nitrogen within nitrogen-doped NMOS gate dielectric material 70 is substantially higher than the overall amount of nitrogen within nitrogen-doped PMOS gate dielectric material 46. In some embodiments, the total concentration of nitrogen within the nitrogen-doped PMOS gate dielectric material 46 may be referred to as a first concentration, and the total concentration of nitrogen within the nitrogen-doped NMOS gate dielectric material 70 may be referred to as a second concentration. The second concentration may be greater than the first concentration by any suitable amount; and in some embodiments may be greater than the first concentration by at least about 30%.

In some embodiments the peak concentrations of nitrogen within the nitrogen-doped NMOS gate dielectric material 70 (peaks 701 and 703 of FIG. 28) may be located within an area from a bottom surface of the nitrogen-doped gate dielectric material 70 to a height of about 1 nm; and the peak concentration of nitrogen within the nitrogen-doped PMOS gate dielectric material 46 (peak 601 of FIG. 28) also may be located within an area from a bottom surface of the nitrogen-doped gate dielectric material 46 to a height of about 1 nm.

Figure 29:
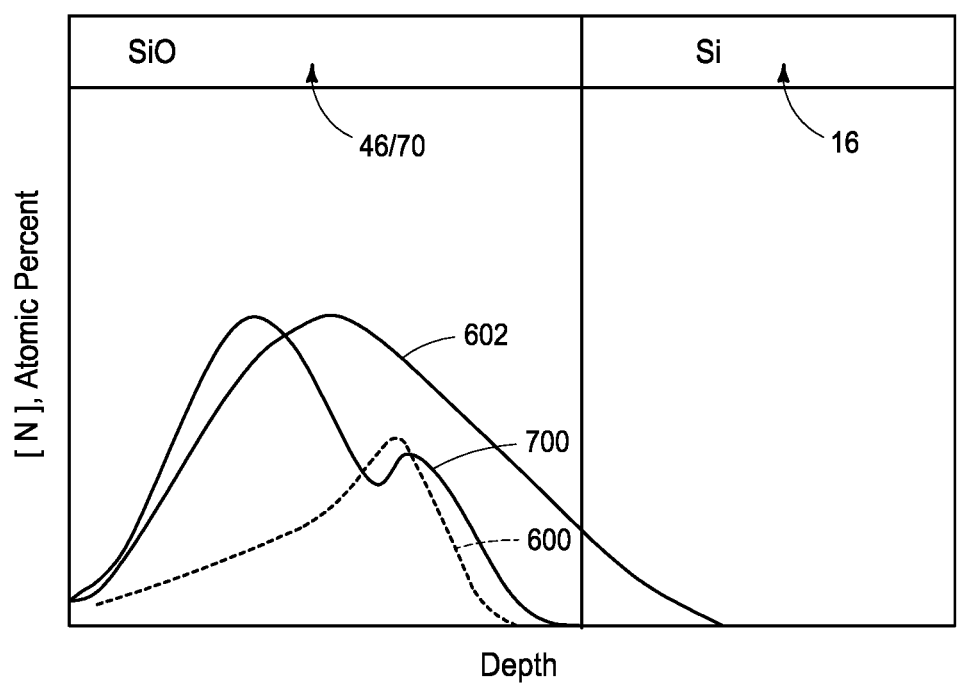
FIG. 29 is a graph of nitrogen concentration, [N], (measured in atomic percent) versus depth; and compares the PMOS and NMOS transistors of FIGS. 13 and 27.

FIG. 29 graphically the compares the curves 600, 602 and 700 to one another; with curve 600 being an example distribution of nitrogen within the nitrogen-doped PMOS gate dielectric material 46 in either of the embodiments of FIGS. 2-13 and FIGS. 16-27; with curve 602 being an example distribution of nitrogen within the nitrogen-doped NMOS gate dielectric material 70 in the embodiment of FIGS. 2-13; and with curve 700 being an example distribution of nitrogen within the nitrogen-doped NMOS gate dielectric material 70 in the embodiment of FIGS. 16-27.

The embodiment of FIGS. 16-27 may be advantageous over that of FIGS. 2-13 in that the implanted nitrogen may be fully contained within the nitrogen-doped NMOS gate dielectric material 70 utilizing the embodiment of FIGS. 16-27, whereas some of the implanted nitrogen may be lost into the underlying substrate 16 when utilizing the embodiment of FIGS. 2-13. Having the nitrogen fully contained within the nitrogen-doped NMOS gate dielectric material 70 may enable a higher concentration of nitrogen to be incorporated into the nitrogen-doped NMOS gate dielectric material 70, which may enable improved performance of an NMOS transistor formed utilizing the embodiment of FIGS. 16-27 as compared to an NMOS transistor formed utilizing the embodiment of FIGS. 2-13. FIGS. 30 and 31 compare operational characteristics of NMOS/PMOS transistors formed utilizing the embodiment of FIGS. 16-27 with operational characteristics of NMOS/PMOS transistors formed utilizing the embodiment of FIGS. 2-13.

Figure 30:
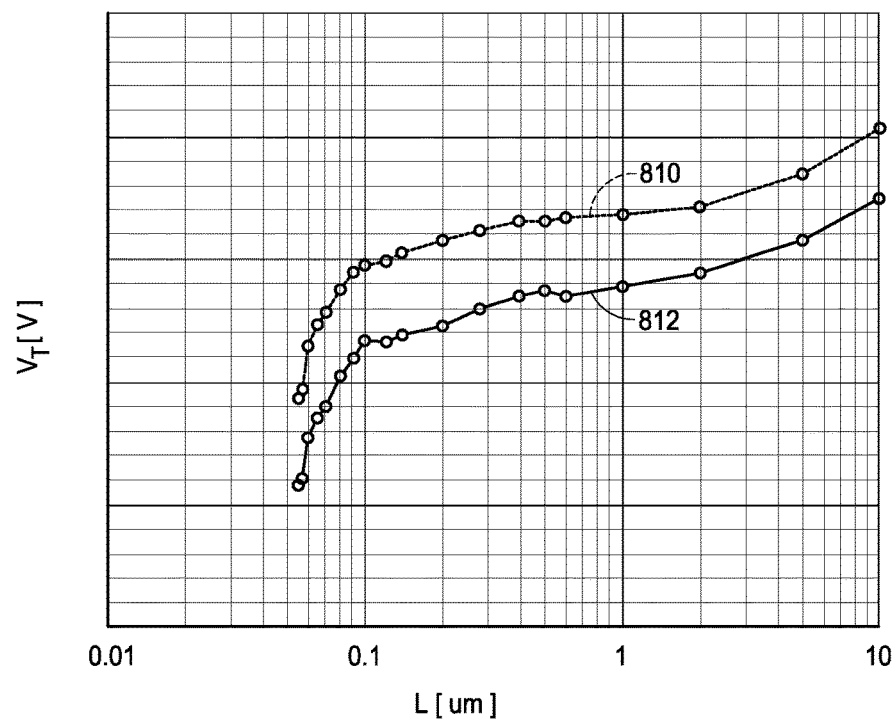
FIG. 30 is a graph of $V_T$ (measured in Volts (V)) versus width, gate length "L", (measured in micrometers (μm)); and compares characteristics of the PMOS transistors of FIGS. 13 and 27.

Referring to FIG. 30, the threshold voltage of PMOS transistors relative to gate length is compared for PMOS transistors formed utilizing the embodiment of FIGS. 2-13

(curve 810) versus PMOS transistors formed utilizing the embodiment of FIGS. 16-27 (curve 812). The threshold voltage may advantageously be dropped by about 60 mV when utilizing the embodiment of FIGS. 16-27 instead of that of FIGS. 2-13.

Figure 31:
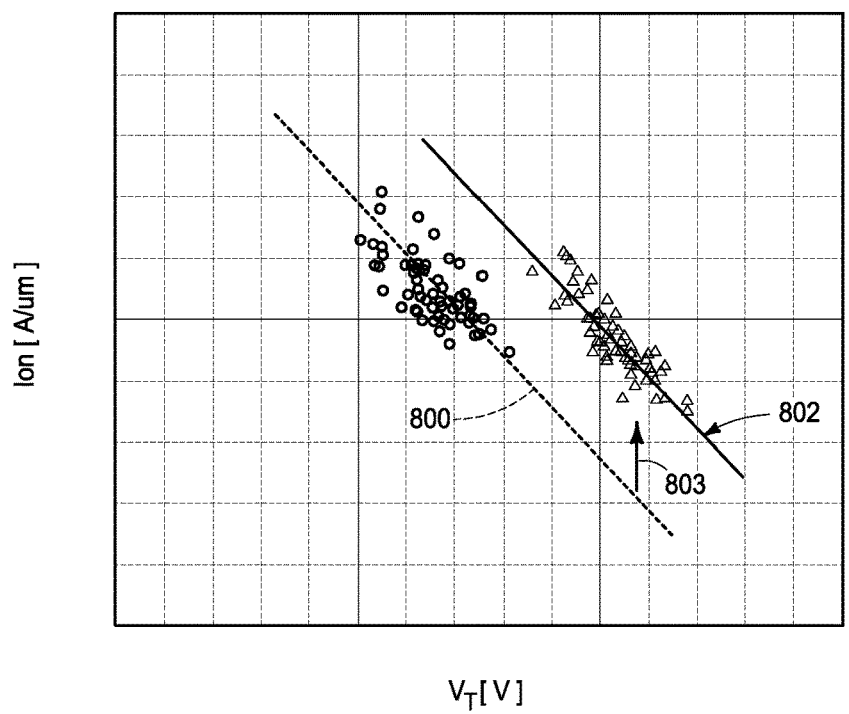
FIG. 31 is a graph of ions, "Ion", (measured in number per μm (A/μm)) versus $V_T$ (measured in Volts (V)); and compares characteristics of the NMOS transistors of FIGS. 13 and 27.

Referring to FIG. 31, active ions are compared relative to threshold voltage for NMOS transistors formed utilizing the embodiment of FIGS. 2-13 (distribution 800) versus NMOS transistors formed utilizing the embodiment of FIGS. 16-27 (distribution 802). There is an improvement of at least about 10%, as indicated by arrow 803.

The structures described herein may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Some embodiments include a semiconductor device which includes a first transistor of a first channel type. The first transistor includes a first gate electrode and a first nitrogen-doped gate dielectric layer. The first nitrogen-doped gate dielectric layer is doped with nitrogen to a first peak concentration. The first transistor also includes a first high-k material between the first nitrogen-doped gate dielectric layer and the first gate electrode. The semiconductor device also includes a second transistor of a second channel type. The second transistor includes a second gate electrode, and a second nitrogen-doped gate dielectric layer. The second nitrogen-doped gate dielectric layer is doped with nitrogen to a second peak concentration which is different from the first peak concentration. The second transistor also includes a second high-k material which is between the second nitrogen-doped gate dielectric layer and the second gate electrode.

Some embodiments include a semiconductor device which includes a PMOS transistor having a first nitrogen-doped gate dielectric layer doped with nitrogen to a first concentration, and an NMOS transistor having a second nitrogen-doped gate dielectric layer doped with nitrogen to a second concentration. The second concentration is at least about 30% greater than the first concentration.

Some embodiments include a method of forming a semiconductor device. A gate dielectric layer is formed to extend across a location of a channel region of a PMOS transistor and across location of a channel region of an NMOS transistor. A first region of the gate dielectric layer is doped with nitrogen to a first concentration. After the first region of the gate dielectric layer is doped with the nitrogen to the first concentration, a second region of the gate dielectric layer is doped with nitrogen to a second concentration different from the first concentration. One of the nitrogen-doped first and second regions of the gate dielectric layer includes a nitrogen-doped NMOS gate dielectric material over the channel region location of the NMOS transistor, and the other of the nitrogen-doped first and second regions of the gate dielectric layer includes a nitrogen-doped PMOS gate dielectric material over the channel region location of the PMOS transistor. The nitrogen-doped NMOS gate dielectric material is doped to a higher concentration of nitrogen than the nitrogen-doped PMOS gate dielectric material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming a semiconductor device comprising:
    forming a gate dielectric layer extending across a location of a channel region of a PMOS transistor and across a location of a channel region of an NMOS transistor;
    doping a first region of the gate dielectric layer with nitrogen to a first concentration;
    after doping the first region of the gate dielectric layer with the nitrogen to the first concentration, doping a second region of the gate dielectric layer with nitrogen to a second concentration different from the first concentration; one of the nitrogen-doped first and second regions of the gate dielectric layer including a nitrogen-doped NMOS gate dielectric material over and in direct physical contact with the channel region location of the NMOS transistor, and the other of the nitrogen-doped first and second regions of the gate dielectric layer including a nitrogen-doped PMOS gate dielectric material over and in direct physical contact with the channel region location of the PMOS transistor; and
    the nitrogen-doped NMOS gate dielectric material being doped to a higher concentration of nitrogen than the nitrogen-doped PMOS gate dielectric material.

2. The method of claim 1, wherein the gate dielectric layer comprises silicon oxide.

3. The method of claim 1, wherein the nitrogen-doped first region of the gate dielectric layer includes the nitrogen-doped PMOS gate dielectric material.

4. The method of claim 3, wherein the nitrogen doping of the first region of the gate dielectric layer is accomplished utilizing a blanket nitrogen implant which also dopes the nitrogen into the second region of the gate dielectric layer to the first concentration.

5. The method of claim 1, wherein the nitrogen-doped first region of the gate dielectric layer includes the nitrogen-doped NMOS gate dielectric material.

6. The method of claim 1, wherein the nitrogen concentration doped into the nitrogen-doped NMOS gate dielectric material is at least about 30% greater than the nitrogen concentration doped into the nitrogen-doped PMOS gate dielectric material.

7. The method of claim 1, comprising forming a PMOS gate over the nitrogen-doped PMOS gate dielectric material; with the PMOS gate including a metal-containing composition spaced from the nitrogen-doped PMOS gate dielectric material by aluminum oxide and an additional oxide.

8. The method of claim 7, comprising forming an NMOS gate over the nitrogen-doped NMOS gate dielectric material; with the NMOS gate including the metal-containing composition spaced from the nitrogen-doped NMOS gate dielectric material by the additional oxide and not having aluminum oxide between the nitrogen-doped NMOS gate dielectric material and the metal-containing composition.

9. The method of claim 8, wherein the additional oxide comprises hafnium oxide.

10. The method of claim 8, wherein the metal-containing composition is a metal nitride.

11. The method of claim 1 wherein the first region of the gate dielectric layer includes the nitrogen-doped NMOS gate dielectric, the method comprising:
  prior to the doping of the first region of the gate dielectric layer with the nitrogen, forming a blocking mask over the second region of the gate dielectric layer; the blocking mask comprising silicon dioxide over a first silicon-containing material;
  the doping of the first region of the gate dielectric layer with the nitrogen being conducted while the blocking mask is over the second region of the gate dielectric layer, and forming the nitrogen-doped NMOS gate dielectric material;
  after the doping of the first region of the gate dielectric layer with the nitrogen, forming a second mask over at least some of the first region of the gate dielectric layer; the second mask comprising silicon dioxide over a second silicon-containing material; the first and second silicon-containing materials being a same composition as one another;
  simultaneously removing the blocking mask and the second mask to expose the nitrogen-doped first region of the gate dielectric layer and the second region of the gate dielectric layer; and
  doping the exposed second region of the gate dielectric layer with nitrogen to form the nitrogen-doped PMOS gate dielectric material, the doping of the exposed second region of the gate dielectric layer being conducted with a blanket nitrogen implant that also provides additional nitrogen dopant into the exposed nitrogen-doped first region of the gate dielectric layer.

12. The method of claim 1, comprising:
  after doping the first region of the gate dielectric layer with the nitrogen; forming a blocking mask over at least some of the first region of the gate dielectric layer; the blocking mask comprising silicon dioxide over a first silicon-containing material;
  the doping of the second region of the gate dielectric layer with the nitrogen being conducted while the blocking mask is over said at least some of the first region of the gate dielectric layer;
  after the doping of the second region of the gate dielectric layer with the nitrogen, forming a second mask over at least some of the second region of the gate dielectric layer; the second mask comprising silicon dioxide over a second silicon-containing material; the first and second silicon-containing materials being a same composition as one another; and
  simultaneously removing the blocking mask and the second mask to expose the nitrogen-doped NMOS gate dielectric material and the nitrogen-doped PMOS gate dielectric material.

13. The method of claim 12 wherein the doping of the first region of the gate dielectric layer with the nitrogen is conducted while no blocking mask is over both of the first region of the gate dielectric layer and the second region of the gate dielectric layer.

14. The method of claim 12 wherein the simultaneous removal of the blocking mask and the second mask utilizes a wet etch of the silicon dioxide of the blocking mask and the second mask, followed by at least one of a dry etch and a wet etch of the first and second silicon-containing materials of the blocking mask and the second mask.

15. The method of claim 1, wherein an isolation region is between the channel region of the PMOS transistor and the channel region of the NMOS transistor, and wherein the gate dielectric layer is formed to extend across the isolation region.

16. The method of claim 15, wherein the nitrogen-doped first region includes a first portion extending over the isolation region, and wherein the nitrogen-doped second region includes a second portion extending over the isolation region.

17. The method of claim 16, wherein the first portion extends more than halfway across an upper surface of the isolation region.

18. The method of claim 16, comprising removing the first and second portions from over the isolation region.

19. A method of forming a semiconductor device comprising:
  forming a gate dielectric material extending across a location of a channel region of a PMOS transistor and across a location of a channel region of an NMOS transistor;
  doping the gate dielectric material across the channel region of the PMOS transistor with nitrogen to a first concentration, thereby forming a first nitrogen doped region in direct physical contact with the channel region of the PMOS transistor;
  doping the gate dielectric material across the channel region of the NMOS transistor to a second concentration that is at least about 30% greater than the first concentration, thereby forming a second nitrogen doped region in direct physical contact with the channel region of the NMOS transistor;
  forming a first oxide over the gate dielectric material;
  forming a second oxide over the second oxide;
  forming a metal-containing composition over the second oxide; and
  wherein the PMOS transistor includes both the first oxide and the second oxide, and wherein the NMOS transistor comprises only the first oxide between the gate dielectric material and the metal-containing composition.

20. The method of claim 19 wherein the metal-containing composition is a metal nitride, the first oxide is hafnium oxide and the second oxide is aluminum oxide.

* * * * *